(12) United States Patent
Miyake et al.

(10) Patent No.: US 7,994,567 B2
(45) Date of Patent: Aug. 9, 2011

(54) SEMICONDUCTOR DEVICE AND A METHOD OF MANUFACTURING THE SAME

(75) Inventors: Tomoyuki Miyake, Higashimurayama (JP); Masatoshi Morikawa, Hanno (JP); Yutaka Hoshino, Akishima (JP); Makoto Hatori, Fussa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 12/823,453

(22) Filed: Jun. 25, 2010

(65) Prior Publication Data

US 2010/0258876 A1 Oct. 14, 2010

Related U.S. Application Data

(63) Continuation of application No. 11/645,577, filed on Dec. 27, 2006, now Pat. No. 7,791,131, which is a continuation of application No. 10/902,130, filed on Jul. 30, 2004, now Pat. No. 7,176,520.

(30) Foreign Application Priority Data

Sep. 5, 2003 (JP) ................................. 2003-313971

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ......... 257/327; 257/341; 257/288; 257/344
(58) Field of Classification Search .................. 257/327, 257/349, 341, 342, 344, 288, 350, 346, 351
See application file for complete search history.

(56) References Cited

U.S. PATENT DOCUMENTS

| 4,600,933 A | 7/1986 | Richman |
| 5,155,563 A | 10/1992 | Davies et al. |
| 5,578,509 A | 11/1996 | Fujita |
| 5,716,861 A | 2/1998 | Moslei et al. |

(Continued)

FOREIGN PATENT DOCUMENTS

JP 58-219766 12/1983

(Continued)

OTHER PUBLICATIONS

Office Action in Japanese Patent Appln. Ser. No. 2010-020255, dated Oct. 19, 2010 (2 pgs.) [in Japanese].

(Continued)

*Primary Examiner* — Chuong A. Luu
(74) *Attorney, Agent, or Firm* — Antonelli, Terry, Stout & Kraus, LLP.

(57) ABSTRACT

To reduce the size and improve the power added efficiency of an RF power module having an amplifier element composed of a silicon power MOSFET, the on resistance and feedback capacitance, which were conventionally in a trade-off relationship, are reduced simultaneously by forming the structure of an offset drain region existing between a gate electrode and an n$^+$ type drain region of the power MOSFET into a double offset one. More specifically, this is accomplished by adjusting the impurity concentration of an n$^-$ type offset drain region, which is closest to the gate electrode, to be relatively low and adjusting the impurity concentration of an n type offset drain region, which is distant from the gate electrode, to be relatively high.

9 Claims, 19 Drawing Sheets

U.S. PATENT DOCUMENTS

| | | | |
|---|---|---|---|
| 5,929,488 | A | 7/1999 | Endou |
| 6,002,154 | A | 12/1999 | Fujita |
| 6,020,611 | A | 2/2000 | Ma et al. |
| 6,025,239 | A | 2/2000 | Yu |
| 6,191,460 | B1 | 2/2001 | Choi et al. |
| 6,420,771 | B2 | 7/2002 | Gregory |
| 6,605,842 | B2 | 8/2003 | Hoshino et al. |
| 6,713,820 | B2 | 3/2004 | Omi et al. |
| 6,864,533 | B2 * | 3/2005 | Yasuhara et al. ............ 257/342 |

FOREIGN PATENT DOCUMENTS

| | | |
|---|---|---|
| JP | 63-12861 | 1/1988 |
| JP | 03-171740 | 7/1991 |
| JP | 5-110080 | 4/1993 |
| JP | 05-218321 | 8/1993 |
| JP | 6-310717 | 4/1994 |
| JP | 06-097447 | 8/1994 |
| JP | 06-232153 | 8/1994 |
| JP | 7-130898 | 5/1995 |
| JP | 7-283414 | 10/1995 |
| JP | 11-54509 | 2/1999 |
| JP | 11-204799 | 7/1999 |
| JP | 2001-94094 | 4/2001 |
| JP | 2001-127169 | 5/2001 |
| JP | 2002-076337 | 3/2002 |
| JP | 2002-158353 | 5/2002 |
| JP | 2002-343960 | 11/2002 |
| JP | 2002-368121 | 12/2002 |
| JP | 2003-7844 | 1/2003 |

OTHER PUBLICATIONS

Japanese Office Action of Appln. 2005-513609 dated Dec. 1, 2009.
International Search Report of Appln. No. PCT/JP2004/011317 in English.

* cited by examiner

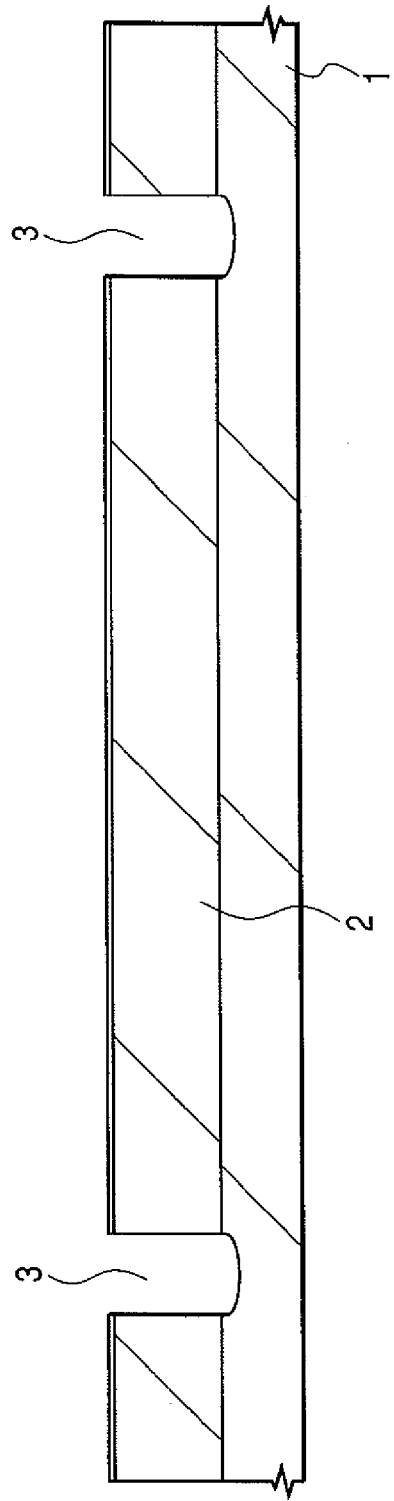
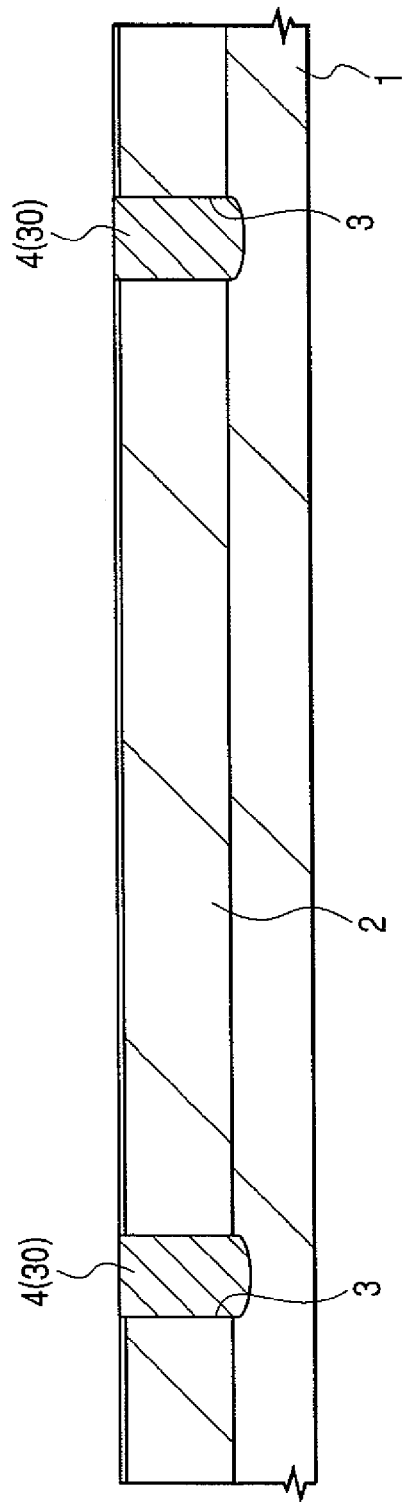

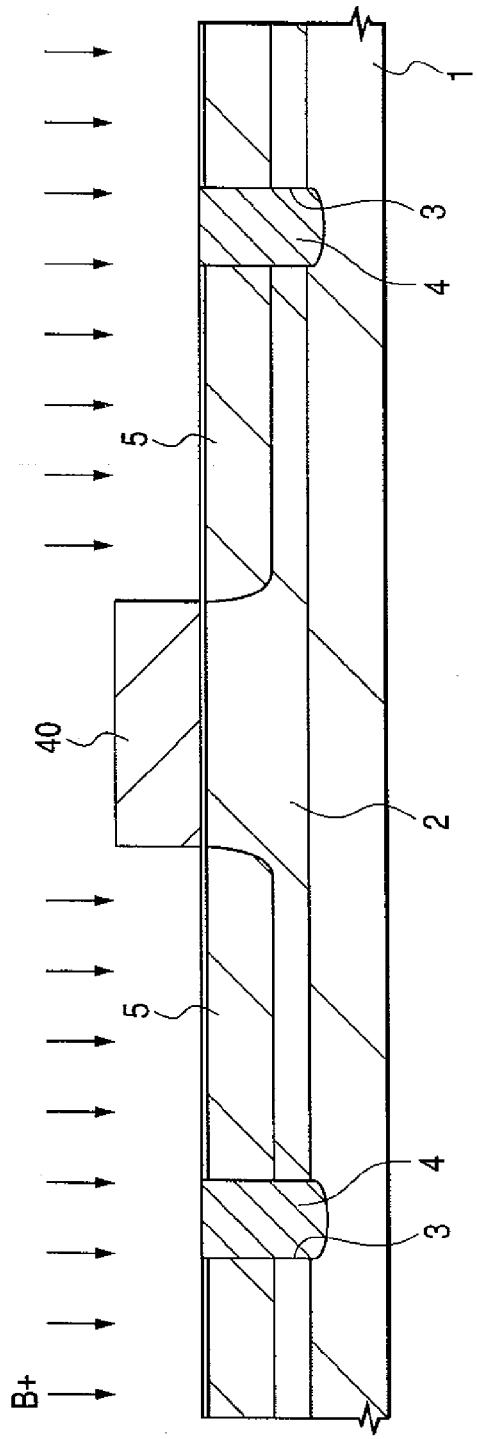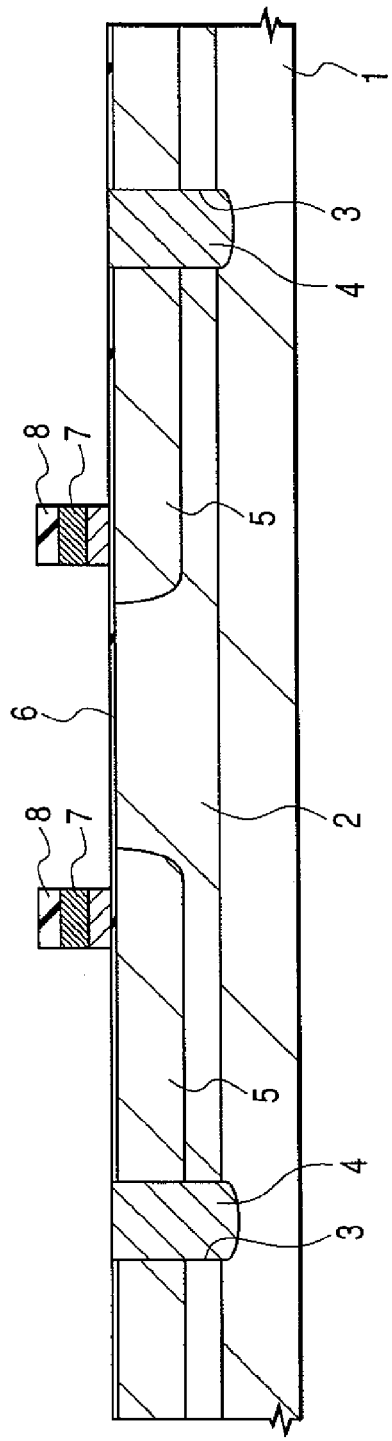

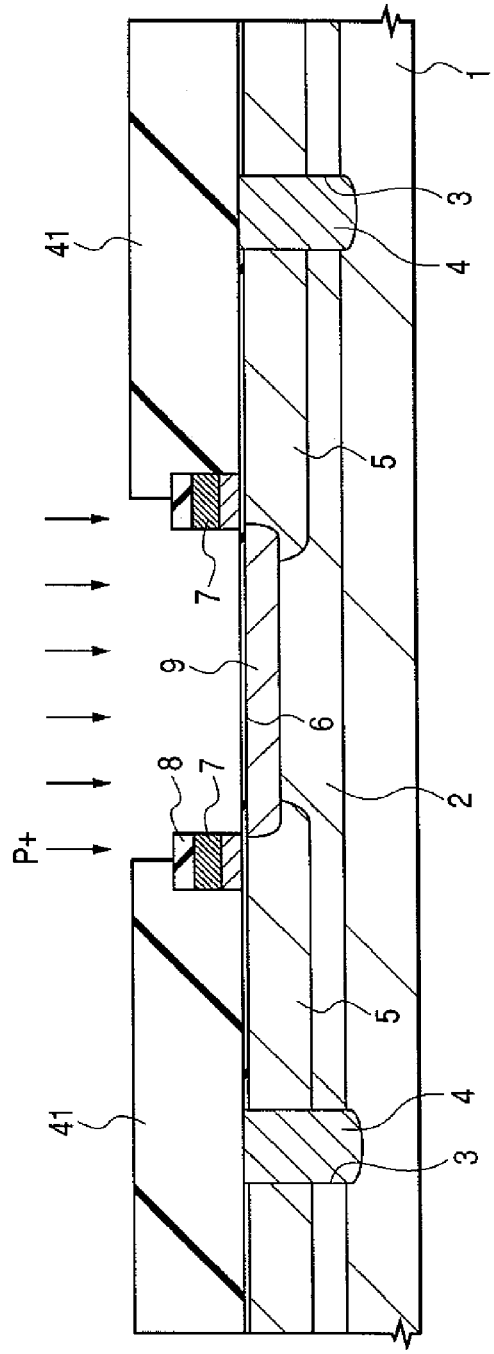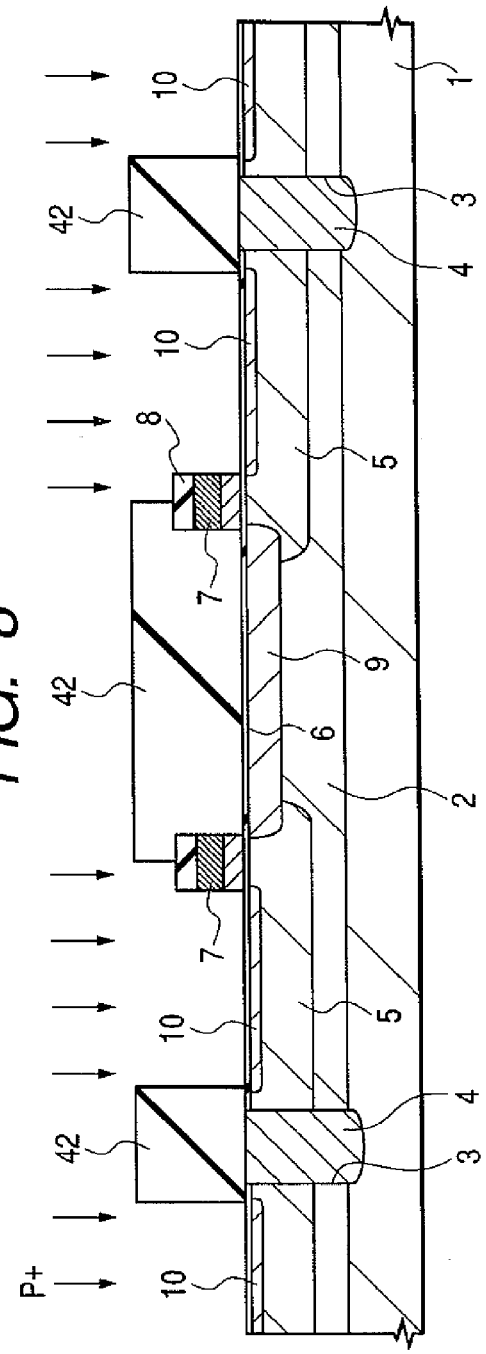

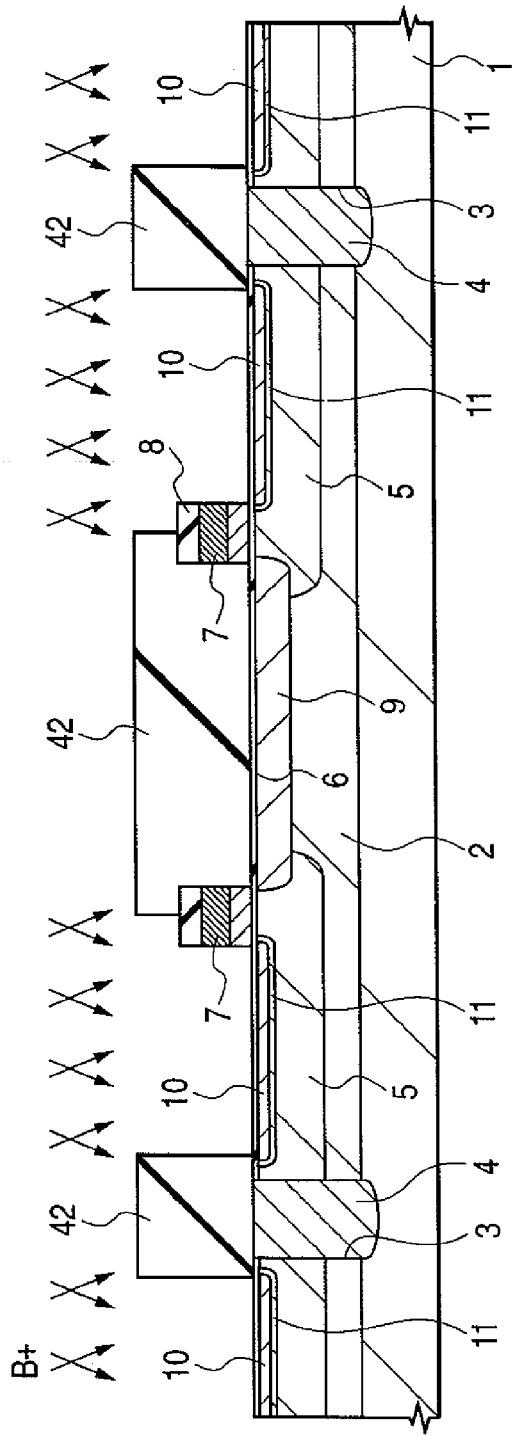
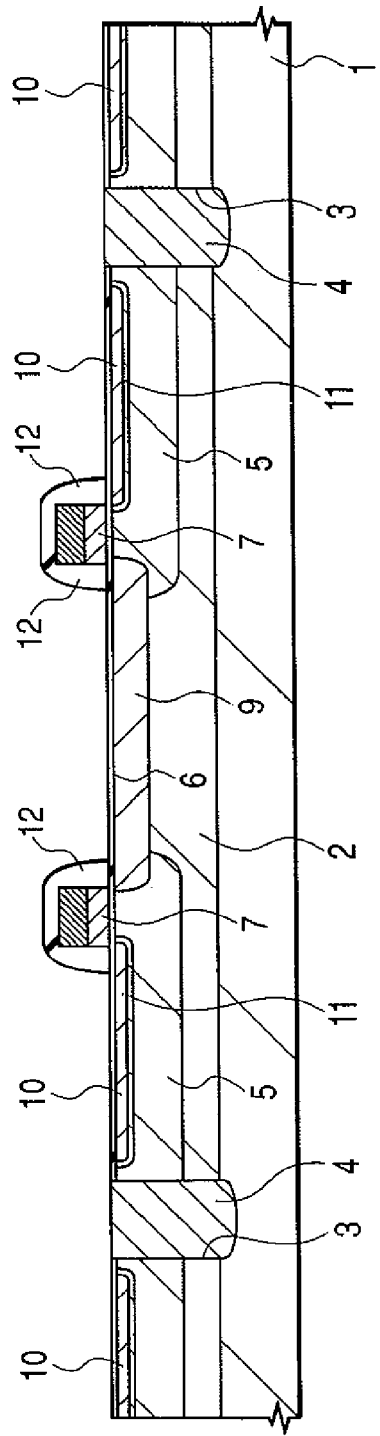

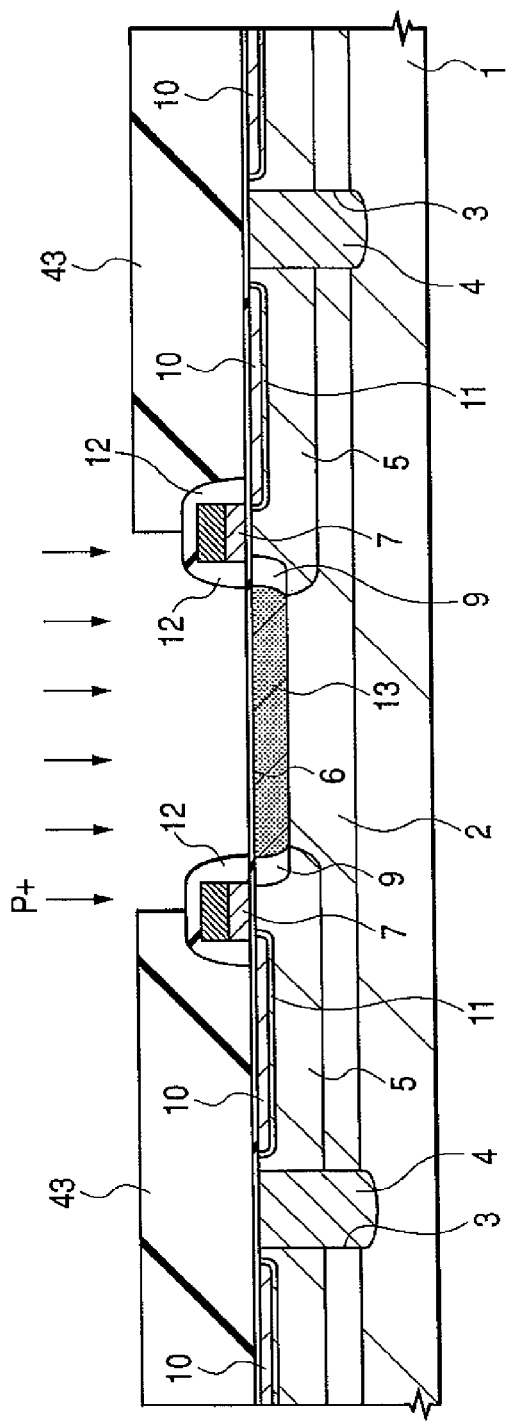
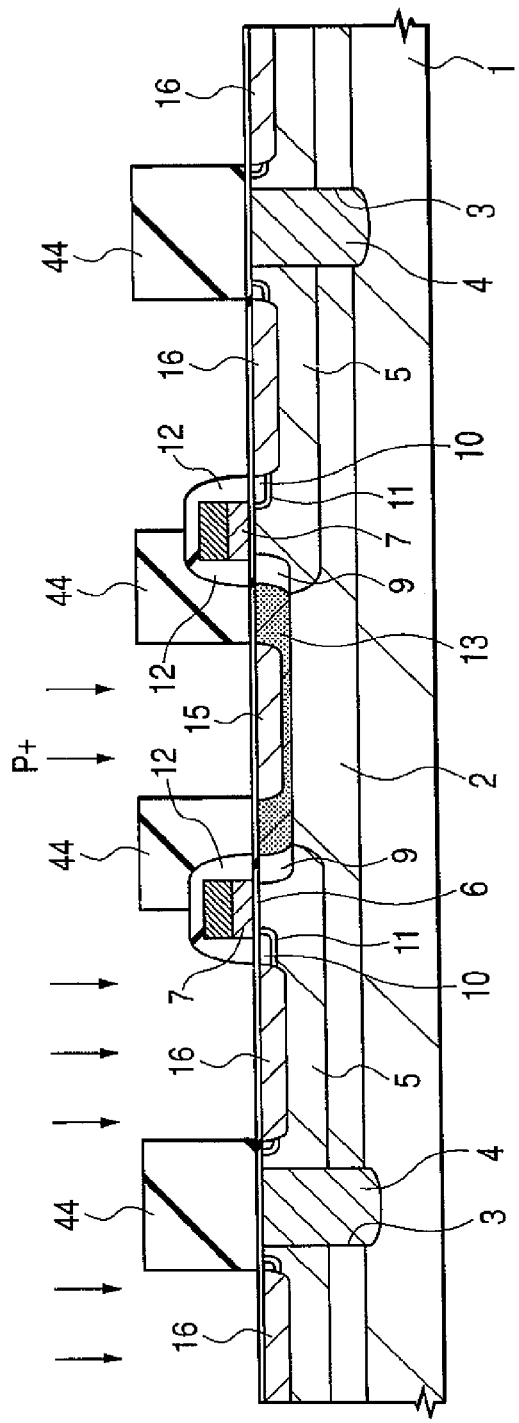

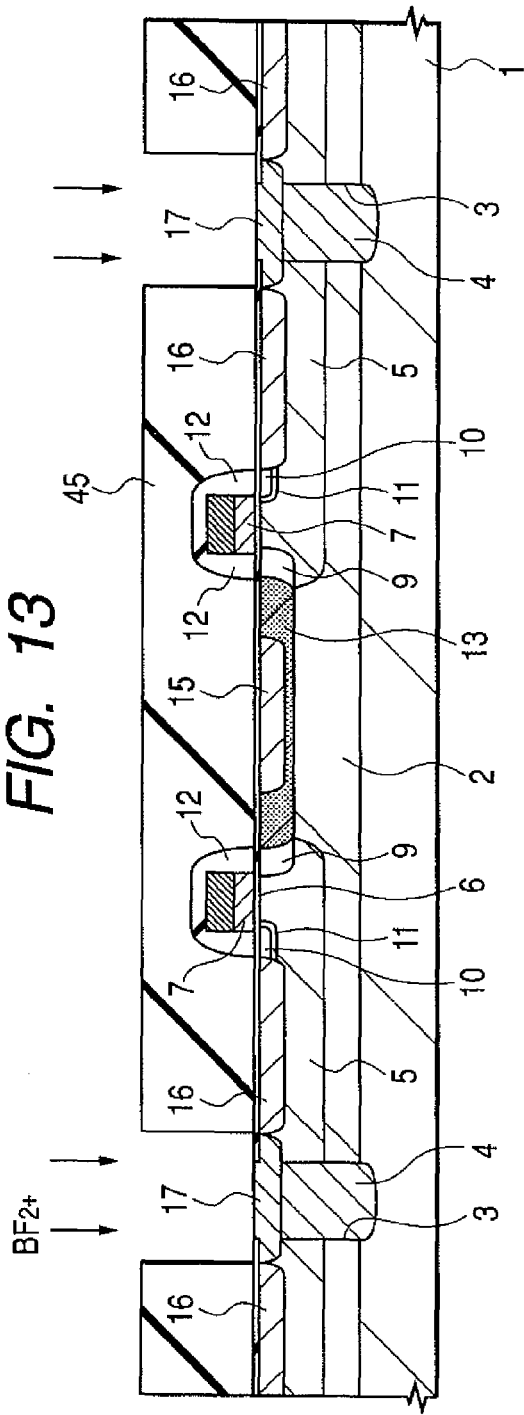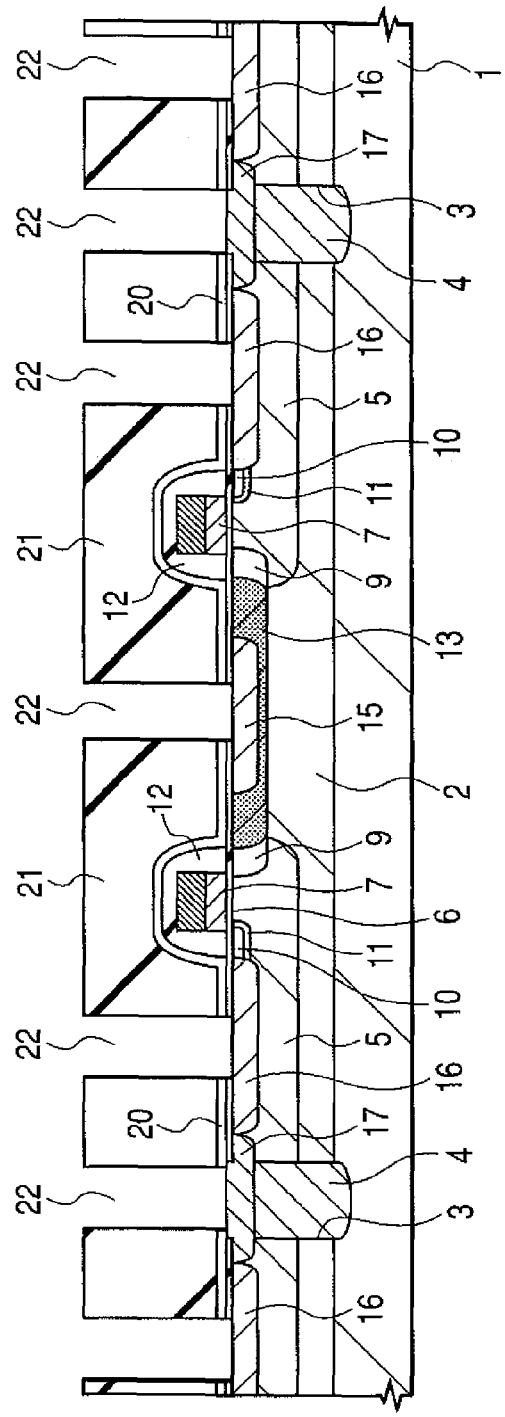

|  | ON RESISTANCE Ron(Ω mm) | FEEDBACK CAPACITANCE Crss(pF/mm) |
|---|---|---|
| PRESENT INVENTION | 3.15 | 0.098 |
| CONVENTIONAL STRUCTURE | 3.40 | 0.104 |

CELL PITCH

CELL PITCH

CELL PITCH

SEMICONDUCTOR DEVICE AND A METHOD OF MANUFACTURING THE SAME

CROSS-REFERENCE TO RELATED APPLICATION

The present application is a continuation of Ser. No. 11/645,577 filed Dec. 27, 2006 now U.S. Pat. No. 7,791,131, which is a continuation of U.S. application Ser. No. 10/902,130, filed Jul. 30, 2004, now U.S. Pat. No. 7,176,520, which claims priority from Japanese Patent application JP2003-313971, filed on Sep. 5, 2003, the contents of each of which are hereby incorporated by reference into this application.

BACKGROUND OF THE INVENTION

The present invention relates to a semiconductor device to be used for mobile communication apparatuses (so called mobile phones) and to a technique for the manufacture thereof, particularly to a technique that is effective when applied to a semiconductor device to be mounted on an RF (Radio Frequency) power module.

In recent years, mobile communication apparatuses (so called mobile phones), which employ a communication system typified by GSM (Global System for Mobile Communications), PCS (Personal Communication Systems), PDC (Personal Digital Cellular) system or CDMA (Code Division Multiple Access) system, have gained widespread use throughout the world.

In general, such mobile communication apparatuses are each composed of an antenna for emitting and receiving electric waves, a high frequency power amplifier for amplifying power-modulated high-frequency signals and supplying them to the antenna, a receiver for processing high frequency signals received by the antenna, a controller for controlling them and a cell (battery) for supplying a power supply voltage.

Japanese Unexamined Patent Publication No. Hei 6(1994)-310717(Patent Document 1) discloses a technique for manufacturing a high voltage MOSFET having, on a drain side, a heavily doped drain region via a lightly doped offset drain region. The improvement is constituted by the fact that an impurity is ion-implanted into the sidewalls of a gate electrode twice, that is, before and after formation of sidewall spacers, to give an LDD (Lightly Doped Drain) structure to a source.

U.S. Pat. No. 6,020,611 discloses a technique for the manufacture of a high voltage MOSFET having, on a drain side, a highly doped drain region via a lightly doped offset drain region. The improvement here is constituted by the fact that a third drain region is formed between the lightly doped offset drain region and the highly doped drain region by twice performing ion implantation using photoresist films having different patterns as masks.

[Patent Document 1] Japanese Unexamined Patent Publication No. Hei 6(1994)-310717
[Patent Document 2] U.S. Pat. No. 6,020,611

SUMMARY OF THE INVENTION

As an amplifying element to be used for the power amplifier circuit of a mobile communication apparatus, compound semiconductor devices, silicon bipolar transistors, and silicon power insulated gate field effect transistors (which will hereinafter be called power MOSFETs) have been used, depending on the purpose of use or the environment.

Of these, power MOSFETs are amplifying elements having a structure in which a drain is maintained at a high breakdown voltage by disposing, on a drain side, a heavily doped drain region via a lightly doped offset drain region. These elements are advantageous over compound semiconductor devices in providing easy bias control and high mass productivity, in spite of their inferiority in power added efficiency.

Owing to a recent rise in the amount of power consumption of a mobile communication apparatus that has occurred with an increase in the number of its parts, each part must satisfy the requirements for size reduction and the ability to operate at a lower power. Power amplifier circuits consume a particularly large power among the various parts, so that a reduction in the chip size and operation at a lower power are strongly demanded.

Accordingly, one of the problems of a semiconductor device for a mobile communication apparatus which uses a power MOSFET as an amplifying element is to improve the power added efficiency of an amplifier circuit using a power MOSFET. Another problem is to promote a size reduction of the chip on which a power MOSFET serving as an amplifying element is formed.

Improvement of the power added efficiency of an amplifying circuit can be attained by a reduction in the on resistance (Ron) of the power MOSFET and, at the same time, a reduction in the parasitic capacitance between the drain and gate, which is called a feedback capacitance (Cgd). There is however, a trade-off relationship between the on resistance (Ron) and the feedback capacitance (Cgd) of a power MOSFET. An increase in the impurity concentration of an offset drain region is effective for reducing the on resistance (Ron) of the power MOSFET. However, this inevitably increases the feedback capacitance (Cgd), which is a parasitic capacitance formed between the drain and gate, and lowers the power added efficiency of an amplifier circuit. It is therefore necessary to develop a technique that is capable of reducing both the on resistance (Ron and the feedback capacitance (Cgd) in order to improve the power added efficiency of a power MOSFET.

An object of the present invention is to provide a technique for improving the power added efficiency of a semiconductor device for use in mobile communication apparatuses.

Another object of the present invention is to provide a technique for promoting a reduction in chip size of a semiconductor device for mobile communication apparatuses.

The above-described and other objects and novel features of the present invention will be apparent from the following description herein and accompanying drawings.

Of the various aspects and features of the present invention disclosed in the present application, the representative ones will be outlined below.

In one aspect of the present invention, there is provided a semiconductor device having an MOSFET, which comprises: a source and a drain of a second conductivity type formed over a portion of the main surface of a semiconductor substrate of a first conductivity type while being spaced apart by a channel formation region therebetween; a gate electrode formed over the channel formation region via a gate insulating film; sidewall spacers formed over the sidewalls of the gate electrode; and a sinker layer of the first conductivity type which is formed over another portion of the main surface of the semiconductor substrate and is in contact with the source.

The drain of the MOSFET comprises a lightly doped region of the second conductivity type, and a heavily doped region of the second conductivity type formed in contact with the lightly doped region and spaced apart from the channel formation region; and, the lightly doped region further comprises a first lightly doped region, which is in contact with the channel formation region, and a second lightly doped region formed in self alignment with the sidewall spacers and having an impurity concentration which is higher than that of the first lightly doped region.

In another aspect of the present invention, there is also provided a semiconductor device having an MOSFET, which comprises: a source and a drain of a second conductivity type which are formed over a portion of the main surface of a semiconductor substrate of a first conductivity type while being spaced apart by a channel formation region interposed between the source and drain; a gate electrode formed over the channel formation region via a gate insulating film; and a plurality of sinker layers of a first conductivity type which are formed over other portions of the main surface of the semiconductor substrate to be brought in contact with the source.

The source and the drain have finger-shaped plane patterns extending parallel to each other along a first direction of the main surface of the semiconductor substrate; and, the plurality of sinker layers are arranged along the first direction, and the sinker layers each have a rectangular plane pattern such that the longer side thereof is parallel to a second direction intersecting with the first direction.

In a further aspect of the present invention, there is also provided a semiconductor device, which comprises: a source and a drain of a second conductivity type formed in a first region of the main surface of a semiconductor substrate while being spaced by a channel formation region interposed between the source and drain; a gate electrode formed of a polysilicon film over the channel formation region via a gate insulating film; a cap insulating film covering the upper portion of the gate electrode; a stopper insulating film covering the upper portion of the cap insulating film and being different in etching rate from that of the cap insulating film; and an interlayer insulating film covering the upper portion of the stopper insulating film.

A trench penetrating through the interlayer insulating film, stopper insulating film and cap insulating film and reaching the surface of the gate electrode is formed over the gate electrode, and a conductive film having a smaller electric resistance than that of the polysilicon film is embedded in the trench.

In a still further aspect of the present invention, there is also provided a method of manufacture of a semiconductor device, which comprises the steps of forming a gate electrode over the main surface of a semiconductor substrate of a first conductivity type via a gate insulating film, and ion-implanting an impurity into the semiconductor substrate on both sides of the gate electrode to form a source and drain. The drain forming step further comprises the sub-steps of:

(a) ion-implanting an impurity into a drain formation region of the semiconductor substrate and thereby forming a first lightly doped region of a second conductivity type extending, at one end thereof, below the sidewalls of the gate electrode;

(b) after the step (a), forming sidewall spacers over the sidewalls of the gate electrode;

(c) after the step (b), ion-implanting an impurity into a drain formation region of the semiconductor substrate and thereby forming a second lightly doped region of a second conductivity type, which has a higher impurity concentration than that of the first lightly doped region, in self alignment with the sidewall spacers; and (d) ion-implanting an impurity into a portion of the second lightly doped region and thereby forming a heavily doped region of the second conductivity type which has a higher impurity concentration than that of the second lightly doped region and is, at one end thereof, spaced from the lower portion of the sidewalls of the gate electrode.

Advantages available by typical features of the invention disclosed in the present application will be described briefly.

The present invention makes it possible to reduce both the on resistance (Ron) and the feedback capacitance (Cgd) of a power MOSFET, leading to an improvement in the power added efficiency of a semiconductor device for mobile communication apparatuses.

By shunting the gate electrode with a low-resistance plug made of a metal film embedded in a trench formed over the gate electrode of a power MOSFET and thereby reducing its sheet resistance, the provision of an Al alloy wiring region for a shunt becomes unnecessary, and the size of a semiconductor chip on which the power MOSFET is to be formed can be reduced.

BRIEF DESCRIPTION OF THE DRAWINGS

FIG. 3 is a fragmentary cross-sectional view illustrating the semiconductor device of the present invention during its manufacturing step;

FIG. 4 is a fragmentary cross-sectional view illustrating the semiconductor device during a manufacturing step following that of FIG. 3;

FIG. 5 is a fragmentary cross-sectional view illustrating the semiconductor device during a manufacturing step following that of FIG. 4;

FIG. 6 is a fragmentary cross-sectional view illustrating the semiconductor device during a manufacturing step following that of FIG. 5;

FIG. 7 is a fragmentary cross-sectional view illustrating the semiconductor device during a manufacturing step following that of FIG. 6;

FIG. 8 is a fragmentary cross-sectional view illustrating the semiconductor device during a manufacturing step following that of FIG. 7;

FIG. 9 is a fragmentary cross-sectional view illustrating the semiconductor device during a manufacturing step following that of FIG. 8;

FIG. 10 is a fragmentary cross-sectional view illustrating the semiconductor device during a manufacturing step following that of FIG. 9;

FIG. 11 is a fragmentary cross-sectional view illustrating the semiconductor device during a manufacturing step following that of FIG. 10;

FIG. 12 is a fragmentary cross-sectional view illustrating the semiconductor device during a manufacturing step following that of FIG. 11;

FIG. 13 is a fragmentary cross-sectional view illustrating the semiconductor device during a manufacturing step following that of FIG. 12;

FIG. 14 is a fragmentary cross-sectional view illustrating the semiconductor device during a manufacturing step following that of FIG. 13;

DETAILED DESCRIPTION OF THE INVENTION

Figure 1:
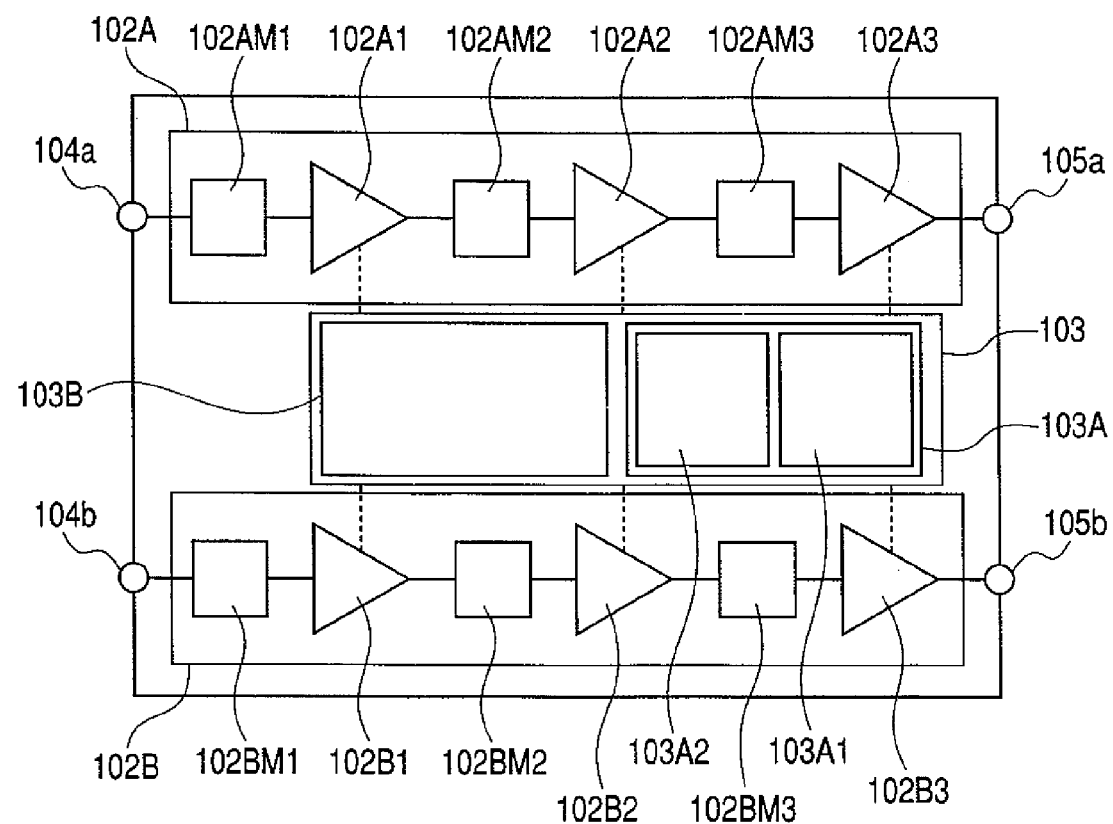
FIG. 1 is a block diagram of an amplifier circuit according to one embodiment of the present invention.

Embodiments of the present invention will be described hereinafter more specifically with reference to the accompanying drawings. In all of the drawings, elements having like function will be identified by like reference numerals, and overlapping descriptions thereof will be omitted.

In the following description, reference will be made to features of the invention after the subject matter of the invention is divided in plural sections or in plural embodiments if necessary for convenience's sake. These plural sections or embodiments are not independent of each other, but are in a relation such that one is a modification, represents details or is a complementary description of a part or whole of the other one, unless otherwise specifically indicated. In the following description, when reference is made to a number of elements (including a number, value, amount and range), the number of elements is not limited to a specific number, but can be greater than or less than the specific number, unless otherwise specifically indicated, or in the case it is principally apparent that the number is limited to the specific number.

Moreover, in the description of the embodiments, it is needless to say that the constituting elements (including element steps) are not always essential, unless otherwise specifically indicated, or in the case where it is principally apparent that they are essential.

Similarly, in the following description of the embodiments, when reference is made to the shape or positional relationship of constituting elements, a shape or positional relationship substantially analogous or similar to it is also embraced, unless otherwise specifically indicated, or in the case where it is utterly different in principle. This also applies to the above-described value and range.

Embodiment 1

Embodiment 1 is a semiconductor device mounted on an RF (Radio Frequency) power module to be used for a digital mobile phone which transmits data by making use of, for example, a GSM system network.

FIG. 1 is a block diagram of an amplifier circuit which constitutes the RF power module of Embodiment 1. In this diagram, there is illustrated an amplifier circuit to be used for an RF power module for which two frequency bands, for example, GSM900 and DCS1800, can be used (dual band system); and, at each frequency band, two communication systems, that is, a GMSK (Gaussian filtered Minimum Shift Keying) modulation system and an EDGE (Enhanced Data GSM Environment) modulation system, can be used.

The amplifier circuit has a power amplifier circuit 102A for GSM900, a power amplifier circuit 102B for DCS1800, and a peripheral circuit 103 which controls or assists the amplifying operation of each of the power amplifier circuits 102A and 102B. The power amplifier circuits 102A and 102B each have three amplifier stages 102A1 to 102A3 and 102B1 to 102B3, respectively, and three matching circuits 102AM1 to 102AM3 and 102BM1 to 102BM3, respectively. More specifically, input terminals 104a and 104b are electrically connected to the inputs of the first-stage amplifier stages 102A1 and 102B1 via matching circuits 102AM1 and 102BM1 for input, respectively; the outputs of the first-stage amplifier stages 102A1 and 102B1 are electrically connected to the inputs of the second-stage amplifier stages 102A2 and 102B2 via interstage matching circuits 102AM2 and 102BM2, respectively; the outputs of the second-stage amplifier stages 102A2 and 102B2 are electrically connected to the inputs of the final-stage amplifier stages 102A3 and 102B3 via interstage matching circuits 102AM3 and 102BM3, respectively; and the outputs of the final-stage amplifier stages 102A3 and 102B3 are electrically connected to the output terminals 105a and 105b, respectively.

The peripheral circuit 103 has a control circuit 103A, and it also has a bias circuit 103B for applying a bias voltage to the above-described amplifier stages 102A1 to 102A3 and 102B1 to 102B3. The control circuit 103A is a circuit that is used for generating a desired voltage to be applied to the above-described power amplifier circuits 102A and 102B, and it has a power control circuit 103A1 and a bias voltage generator circuit 103A2. The power control circuit 103A1 is a circuit used for generating a first power voltage to be applied to drain terminals of a power MOSFET for outputs of the amplifier stages 102A1 to 102A3 and 102B1 to 102B3. The bias voltage generator circuit 103A2 is a circuit used for generating a first control voltage to be applied to control the bias circuit 103B. When the power control circuit 103A1 generates the first power voltage in accordance with an output level indicating signal supplied from a base band circuit outside, the bias voltage generator circuit 103A2 generates the first control voltage based on the first power voltage generated by the power control circuit 103A1. The base band circuit is a circuit used for generating the output level indicating signal. This output level indicating signal is a signal indicating the output levels of the power amplifier circuits 102A and 102B, and they are generated based on the distance between a mobile phone and a base station thereof, that is, an output level according to the intensity of the electric waves.

The power amplifier circuits 102A and 102B have a circuit constitution having three n channel type power MOSFETs cascade-connected successively as the three amplifying stages 102A1 to 102A3 and 102B1 to 102B3, respectively.

Figure 2:
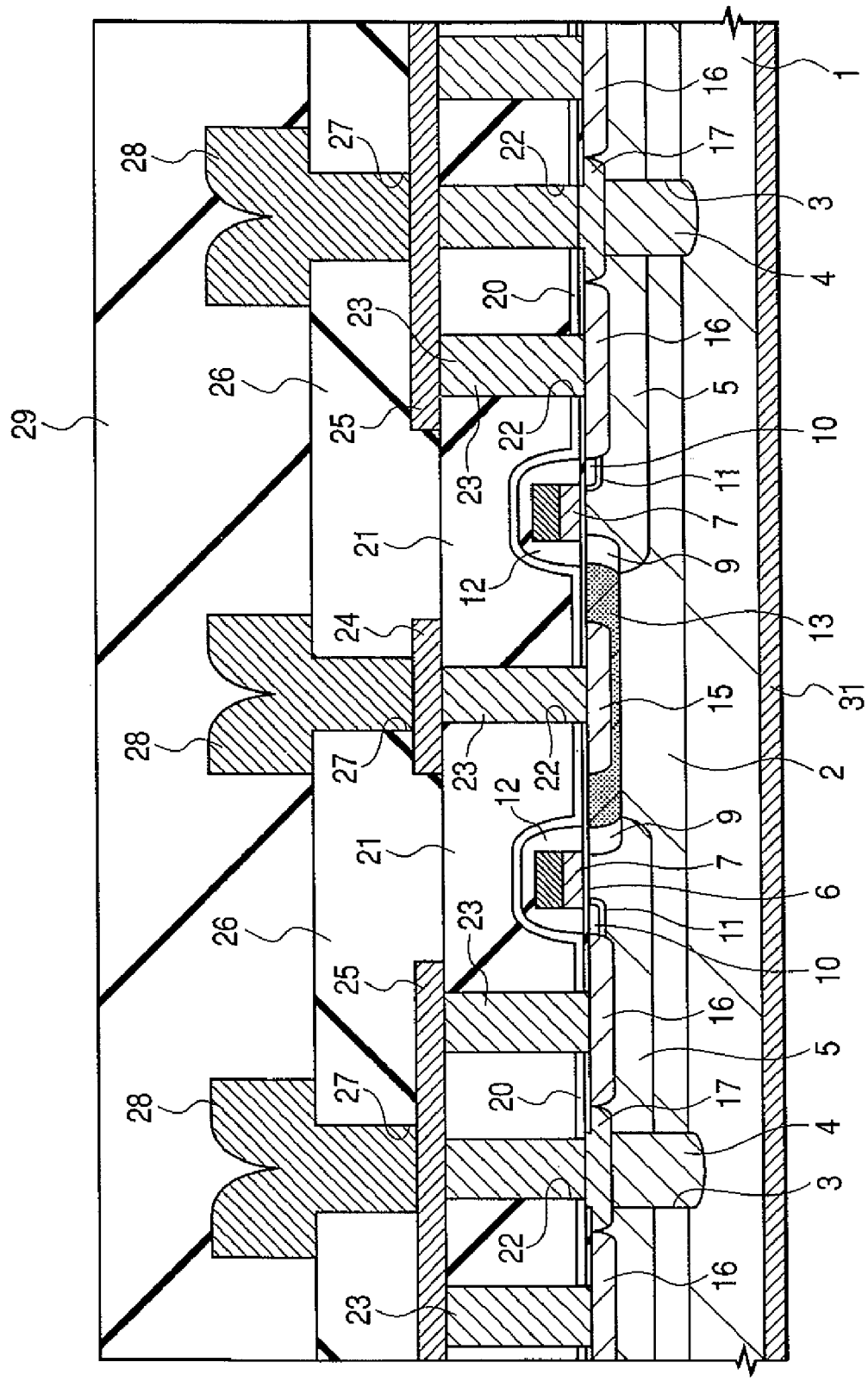
FIG. 2 is a fragmentary cross-sectional view illustrating a semiconductor device of the present invention.

FIG. 2 is a fragmentary cross-sectional view of a semiconductor substrate 1 having the power amplifier circuits 102A and 102B formed thereon.

Over the main surface of the semiconductor substrate (a semiconductor substrate with a first conductivity type, which will hereinafter simply be called a "substrate") 1 having a specific resistance of about 5 mΩcm and which is made of p type single crystal silicon, an epitaxial layer 2 made of p type single crystal silicon having a specific resistance of about 20 Ωcm and a film thickness of about 2 μm is formed. In a portion of the main surface of the epitaxial layer 2, a p well 5 is formed. This p well 5 functions as a punch-through stopper, which inhibits extension of a depletion layer from the drain to the source of the power MOSFET.

Over the surface of the p well 5, a gate electrode 7 of the power MOSFET is formed via a gate insulating film 6 made of silicon oxide. The gate electrode 7 is composed of a film stack, for example, of an n type polysilicon film and a tungsten silicide ($WSi_x$) film. The p well 5 below the gate electrode 7 will constitute a formation region of a channel of the power MOSFET. Over the sidewalls of the gate electrode 7, sidewall spacers 12 made of silicon oxide are formed.

In regions inside the epitaxial layer 2, which are separated from each other with a channel formation region inserted therebetween, a source and a drain of the power MOSFET are formed. The drain has an $n^-$ type offset drain region (first lightly doped region) 9 which is in contact with the channel formation region; an n type offset drain region (second lightly doped region) 13 which is in contact with the $n^-$ type offset drain region 9 and is spaced from the channel formation region; and an $n^+$ type drain region (highly doped offset region) 15 which is in contact with the n type offset drain region 13 and spaced further from the channel formation region. Among the $n^-$ type offset drain region 9, n type offset drain region 13 and $n^+$ type drain region 15, the $n^-$ type offset drain region 9 which is closest to the gate electrode 7 has the lowest impurity concentration, while the $n^+$ drain region 15 which is most distant from the gate electrode has the highest impurity concentration. As described later, the $n^-$ type offset drain region 9 is formed in self alignment with the gate electrode 7, while the n type offset drain region 13 is formed in self alignment with the sidewall spacers 12 over the sidewalls of the gate electrode 7.

As described above, the power MOSFET of this Embodiment is characterized by the fact that an offset drain region existing between the gate electrode 7 and the $n^+$ type drain region 15 is endowed with a double offset structure by adjusting the impurity concentration of the $n^-$ type offset drain region 9 closest to the gate electrode 7 to a relatively low level, while that of the n type offset drain region 13 most distant from the gate electrode 7 is adjusted to be relatively high.

Owing to the above-described structure, a depletion layer extends between the gate electrode 7 and the drain, resulting in a reduction in the feedback capacitance (Cgd) formed between the gate electrode 7 and the $n^-$ type offset drain region 9 in the vicinity thereof. In addition, owing to a high impurity concentration of the n type offset drain region 13, the on resistance (Ron) decreases. Since the n type offset drain region 13 is formed at a position distant from the gate electrode 7, its influence on the feedback capacitance (Cgd) is negligible. In other words, according to the power MOSFET of this Embodiment, the on resistance (Ron) and feedback capacitance (Cgd), which were in a trade-off relationship in the conventional power MOSFET, can be reduced simultaneously, making it possible to improve the power added efficiency of an amplifier circuit.

The source of the power MOSFET has an $n^-$ type source region (lightly doped region) 10 in contact with the channel formation region, and an $n^+$ type source region (heavily doped region) 16 that is in contact with the $n^-$ type source region 10 and is spaced from the channel formation region. The $n^-$ type source region 10 in contact with the channel formation region has a lower impurity concentration and has a shallower depth, compared with the $n^+$ type source region 16 that is spaced from the channel formation region. Below the $n^-$ type source region 10, a p type halo region 11 is formed in order to suppress extension of an impurity from the source to the channel formation region and, moreover, to suppress a short channel effect. As described later, the $n^-$ type source region 10 is formed in self alignment with the gate electrode 7, while the $n^+$ type source region 16 is formed in self alignment with the sidewall spacers 12 over the sidewalls of the gate electrode 7.

At the end (end opposite to a side to be brought into contact with the $n^-$ type source region 10) of the $n^+$ type source region 16, a p type sinker layer 4 is formed in contact with the $n^+$ type source region 16. In the vicinity of the surface of this p type sinker layer 4, a $p^+$ type semiconductor region 17 for reducing the resistance of the surface of the p type sinker layer 4. The p type sinker layer 4 is a conductive layer for connecting the source to the substrate 1. One of the characteristics of the power MOSFET of this Embodiment resides in the fact that the p type sinker layer 4 is formed of a conductive layer made of a p type polysilicon film embedded in a trench 3 formed in the epitaxial layer 2.

In the conventional power MOSFET, a sinker layer is formed by ion-implanting an impurity into the epitaxial layer 2. Although the p type sinker layer that is formed by ion implantation is disadvantageous in that it has an excessively large parasitic resistance per unit area, the p type sinker layer 4 having a small parasitic resistance can be formed by embedding the trench 3 with a heavily doped p type polysilicon film.

A plug 23 in a contact hole 22, which is formed in a silicon nitride film 20 and a silicon oxide film 21, is connected to the upper portion of each of the p type sinker layer 4 ($p^+$ type semiconductor region 17), the source ($n^+$ type source region 16) and drain ($n^+$ type offset drain region 15). The plug 23 is made of a conductive film composed mainly of a W film.

To the p type sinker layer 4 ($p^+$ type semiconductor region 17) and source ($n^+$ type source region 16), a source electrode 25 is connected via the plug 23; while, to the drain ($n^+$ type offset drain region 15), a drain electrode 24 is connected via the plug 23. The source electrode 25 and drain electrode 24 are each formed of a conductive film composed mainly of an aluminum (Al) alloy film.

To the drain electrode 24 and source electrode 25, interconnects 28 are connected via through-holes 27 formed in a silicon oxide film 26 covering the drain electrode 24 and source electrode 25, respectively. The interconnect 28 is formed of a conductive film composed mainly of an aluminum (Al) alloy film. Over the interconnect 28, a surface protective film 29, composed of a film stack consisting of a silicon oxide film and a silicon nitride film, is formed. Over the backside of the substrate 1, a source rear electrode 31, made of a film stack consisting of, for example, a nickel (Ni) film, a titanium (Ti) film, Ni film and gold (Au) film, is formed.

A method of manufacture of the power MOSFET illustrated in FIG. 2 will be described next with reference to FIGS. 3 to 16 in the order of the steps thereof.

As illustrated in FIG. 3, after formation of an epitaxial layer 2, which is made of p type single crystal silicon, over the main surface of the substrate 1, which is made of p type single crystal silicon, by using a known epitaxial growth method, a portion (a sinker layer formation region) of the epitaxial layer 2 is etched by conventional photolithography and dry etching, whereby a trench 3 having a depth of about 2.2 μm and reaching the substrate 1 is formed.

As illustrated in FIG. 4, after deposition of a p type polysilicon film 30 over the substrate 1, including the inside of the trench 3, by CVD, the polysilicon film 30 outside the trench 3 is removed by etchback, whereby a p type sinker layer 4 made of the p type polysilicon film 30 is formed inside of the trench 3. By embedding the inside of the trench 3 with the impurity-doped p type polysilicon film 3 in such a manner, the p type sinker layer 4 having a small parasitic resistance can be formed. Instead of the polysilicon film, a metal film can be embedded inside of the trench 3 to form a sinker layer having a smaller parasitic resistance.

As illustrated in FIG. 5, a p well 5 serving as a punch-through stopper is formed by ion-implanting boron (B) into a portion of the epitaxial layer 2 using a photoresist film 40 as a mask. The p well 5 is formed mainly in the source formation region and channel formation region of the power MOSFET. Ion implantation is effected twice under the following conditions: first, at an acceleration energy of 200 keV and a dosage of $2.0 \times 10^{13}/cm^2$, and, second, at an acceleration energy of 50 keV and a dosage of $1.0 \times 10^{13}/cm^2$.

After washing the surface of the epitaxial layer 2 with hydrofluoric acid, the substrate 1 is heat treated at about 800° C. to form a gate insulating film 6 made of a silicon oxide film and having a thickness of about 11 nm over the surface of the epitaxial layer 2, as illustrated in FIG. 6. As the gate insulating film 6, the thermal oxide film may be replaced with a silicon oxide film containing nitrogen, i.e. a so-called oxynitride film. In this case, trapping of hot electrons on the interface of the gate insulating film 6 can be reduced. Alternatively, the gate insulating film 6 may be formed from a two-layer oxide film obtained by depositing a silicon oxide film over the thermal oxide film by CVD.

A gate electrode 7 is then formed over the gate insulating film 6. This gate electrode 7 is formed, for example, by depositing an n type polysilicon film having a thickness of about 100 nm over the gate insulating film 6 by CVD, depositing a WSi$_x$ film having a thickness of 150 nm over the n type polysilicon film by CVD, depositing a cap insulating film 8 made of a silicon oxide film having a thickness of 150 nm over the WSi$_x$ film by CVD, and then dry etching the cap insulating film 8, WSi$_x$ film and n type polysilicon film using a photoresist film as a mask. The gate electrode 7 has a gate length of about 0.23 μm.

As illustrated in FIG. 7, an n⁻ type offset drain region 9 is then formed by ion-implanting phosphorus (P) into a portion of the epitaxial layer 2 using a photoresist film 41 as a mask. This n⁻ type offset drain region 9 has its ends below the sidewalls of the gate electrode 7 so that each end is brought into contact with the channel formation region. Ion implantation for the formation of the n⁻ type offset drain region 9 is conducted under the conditions, for example, of an acceleration energy of 40 keV and a dosage of $8.0 \times 10^{12}/cm^2$. By lowering the impurity concentration of the n⁻ type offset drain region 9, a depletion layer extends between the gate electrode 7 and drain, leading to a reduction in the feedback capacitance (Cgd) formed therebetween.

After removal of the photoresist film 41, an n⁻ type source region 10 is formed by ion-implanting arsenic (As) into the surface of the p well 5 using a photoresist film 42 as a mask, as illustrated in FIG. 8. Ion implantation is conducted under the conditions, for example, of an acceleration energy of 15 keV and a dosage of $3.0 \times 10^{15}/cm^2$. By ion implantation of an impurity (As) at a low acceleration energy and formation of the n⁻ type source region 10 with a shallow depth, extension of the impurity from the source toward the channel formation region can be controlled, leading to suppression in a lowering of the threshold voltage.

Following the ion implantation of an impurity (As), boron (B) is ion-implanted into the surface of the p well 5 using the photoresist film 42 as a mask, whereby a p type halo region 11 is formed below the n⁻ type source region 10. For this ion implantation, tilt-angle ion implantation in which an impurity is ion-implanted at a tilt angle of 30° relative to the main surface of the substrate 1 is employed. For example, after ion implantation of an impurity at an acceleration energy of 15 keV and a dosage of $7.0 \times 10^{12}/cm^2$, a 90° rotation of the substrate 1 is repeated four times. The formation of the p type halo region 11 is not always necessary, but it contributes to further suppression in the extension of the impurity from the source toward the channel formation region, and it also contributes to further suppression in short channel effects so that a lowering of the threshold voltage can be suppressed further.

After removal of the photoresist film 42, sidewall spacers 12 are formed over the sidewalls of the gate electrode 7, as illustrated in FIG. 10. The sidewall spacers 12 are formed by depositing a silicon oxide film over the substrate 1 by CVD, followed by anisotropic etching of this silicon oxide film. As the silicon oxide film for the sidewall spacers 12, an HLD (High Temperature Low Pressure Decomposition) film obtained by thermal decomposition of TEOS (tetraethyl orthosilicate), which is an organic source, is employed. This HLD film features excellent uniformity in thickness and difficulty in diffusion of an impurity therein.

As illustrated in FIG. 11, using a photoresist film 43 having an opening over the drain formation region as a mask, phosphorus (P) is ion-implanted into a portion of the n⁻ type offset drain region 9. This ion implantation is effected, for example, under the conditions of an acceleration energy of 40 keV and a dosage of $8.0 \times 10^{12}/cm^2$. By this ion implantation, an n type offset drain region 13 is formed in self alignment with the sidewall spacers 12 that are formed over the sidewalls, on the drain side, of the gate electrodes 7.

The acceleration energy of this ion implantation is equal to that of the ion implantation for the formation of the n⁻ type offset drain region 9, so that the junction depth of the n type offset drain region 13 is almost equal to that of the n⁻ type offset drain region 9. In addition, the impurity (P) implanted into the n type offset drain region 13 has the same conductivity type as that implanted into the n⁻ type offset drain region 9, so that the impurity concentration of the n type offset drain region 13 becomes higher than that of the n⁻ type offset drain region 9. In other words, the resistance of the n type offset drain region 13 becomes lower than that of the n⁻ type offset drain region 9, so that the on resistance (Ron) can be reduced.

The n⁻ type offset drain region 9 is formed in self alignment with the gate electrode 7, while the n type offset drain region 13 is formed in self alignment with the sidewall spacers 12 on the sidewalls of the gate electrode 7, so that the n type offset drain region 13 is spaced from the gate electrode 7 by a distance corresponding to the thickness of the sidewall spacers 12 extending along the gate length direction. Therefore, even an increase in the impurity concentration in the n type offset drain region 13 has only a slight influence on the feedback capacitance (Cgd).

After removal of the photoresist film 43, with a photoresist film 44 having an opening over each of a portion of the n type offset drain region 13 and the p well 5 of the source formation region, arsenic (As) is ion-implanted into the above-described portion of each of the n type offset drain region 13 and p well 5, as illustrated in FIG. 12. This ion implantation is effected, for example, under the conditions of an acceleration energy of 60 keV and a dosage of $8.0 \times 10^{15}/cm^2$.

By the above-described ion implantation, an n⁺ type drain region 15 having a higher impurity concentration than that of the n type offset drain region 13 and which is more distant from the channel formation region than the n type offset drain region 13 is formed in a portion of the n type offset drain region 13. At this time, by forming the highly doped n⁺ type drain region 15 with a smaller thickness than that of the lightly-doped n type offset drain region 13 or n⁻ type offset drain region 9, a parasitic capacitance (drain capacitance) between source and drain can be reduced.

By the above-described ion implantation, an n⁺ type source region 16 having a higher impurity concentration than that of the n⁻ type source region 10, and which has a bottom position deeper than that of the n⁻ type source region 10, is also formed in the p well 5. This n⁺ type source region 16 is formed in self alignment with the sidewall spacers 12 over the sidewalls of the gate electrode 7, so that it is separated from the channel formation region by a distance corresponding to the thickness of the sidewall spacers 12 extending along the gate length direction.

By the formation of the n⁺ type source region 16 in self alignment with the sidewall spacers 12, as described above, the distance between the n⁺ type source region 16 and the channel formation region can be defined with high accuracy. If the n⁺ type source region 16 is spaced from the channel formation region by ion implantation using a photoresist film as a mask without forming sidewall spacers 12 over the sidewalls of the gate electrode 7, misalignment of the photomask causes variations in the distance between the n⁺ type source region 16 and the channel formation region. In this case, if the end portion of the n⁺ type source region 16 comes too close to the channel formation region, the impurity in the n⁺ type source region 16 diffuses in the channel formation region, causing variations in the threshold voltage. Too long a distance between the end portion of the n⁺ type source region 16 and channel formation region, on the other hand, increases the source resistance.

According to this Embodiment, in which the n⁺ type source region 16 is formed in self alignment with the sidewall spacers 12, problems as described above can be avoided even if the power MOSFET is miniaturized. It is therefore possible to promote miniaturization of the power MOSFET.

By the steps so far described, a power MOSFET having a drain composed of an n⁻ type offset drain region 9, an n type offset drain region 13 and an n⁺ type drain region 15, and a source composed of an n⁻ type source region 10 and an n⁺ type source region 16 is completed.

After removal of the photoresist film 44, using as a mask a photoresist film 45 having an opening over the p type sinker layer 4, boron fluoride (BF$_2$) is ion-implanted into the surface of the p type sinker layer 4, whereby a p⁺ type semiconductor region 17 is formed and the resistance of the surface of the p type sinker layer 4 is lowered. Ion implantation is effected, for example, under the conditions of an acceleration energy of 50 keV and a dosage of $2.0 \times 10^{15}$ cm$^2$.

After removal of the photoresist film 45, as illustrated in FIG. 14, contact holes 22 are formed over the p type sinker layer 4 (p⁺ type semiconductor region 17), the source (n⁺ type source region 16) and the drain (n⁺ type drain region 15), respectively, by depositing a silicon nitride film 20 having a thickness of about 50 nm and a silicon oxide film 21 having a thickness of about 800 nm over the substrate 1 by CVD, planarizing the surface of the silicon oxide film 21 by chemical mechanical polishing, and dry etching the silicon oxide film 21 and silicon nitride film 20 using a photoresist film as a mask.

Figure 15:
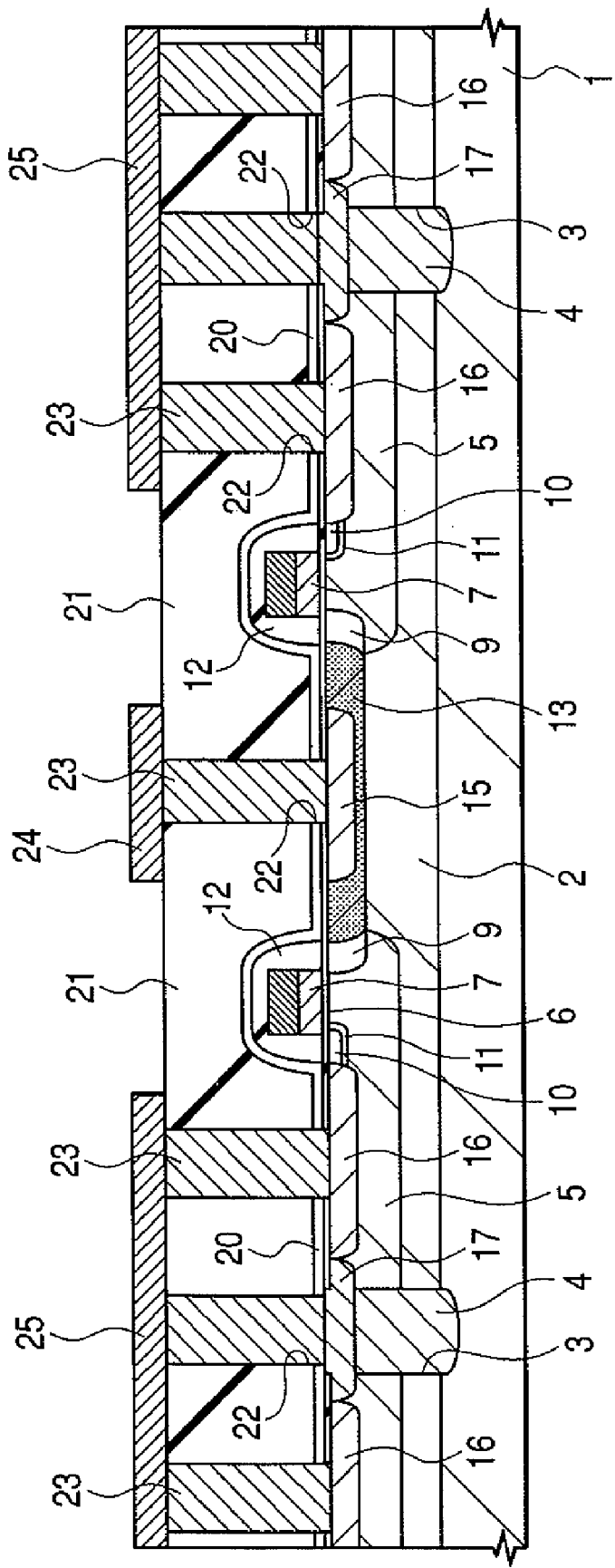
FIG. 15 is a fragmentary cross-sectional view illustrating the semiconductor device during a manufacturing step following that of FIG. 14.

As illustrated in FIG. 15, a plug 23 composed mainly of a W film is buried inside of each of the contact holes 22, followed by the formation, over the silicon oxide film 21, of a drain electrode 24 and a source electrode 25 composed mainly of an aluminum (Al) alloy film.

Figure 16:
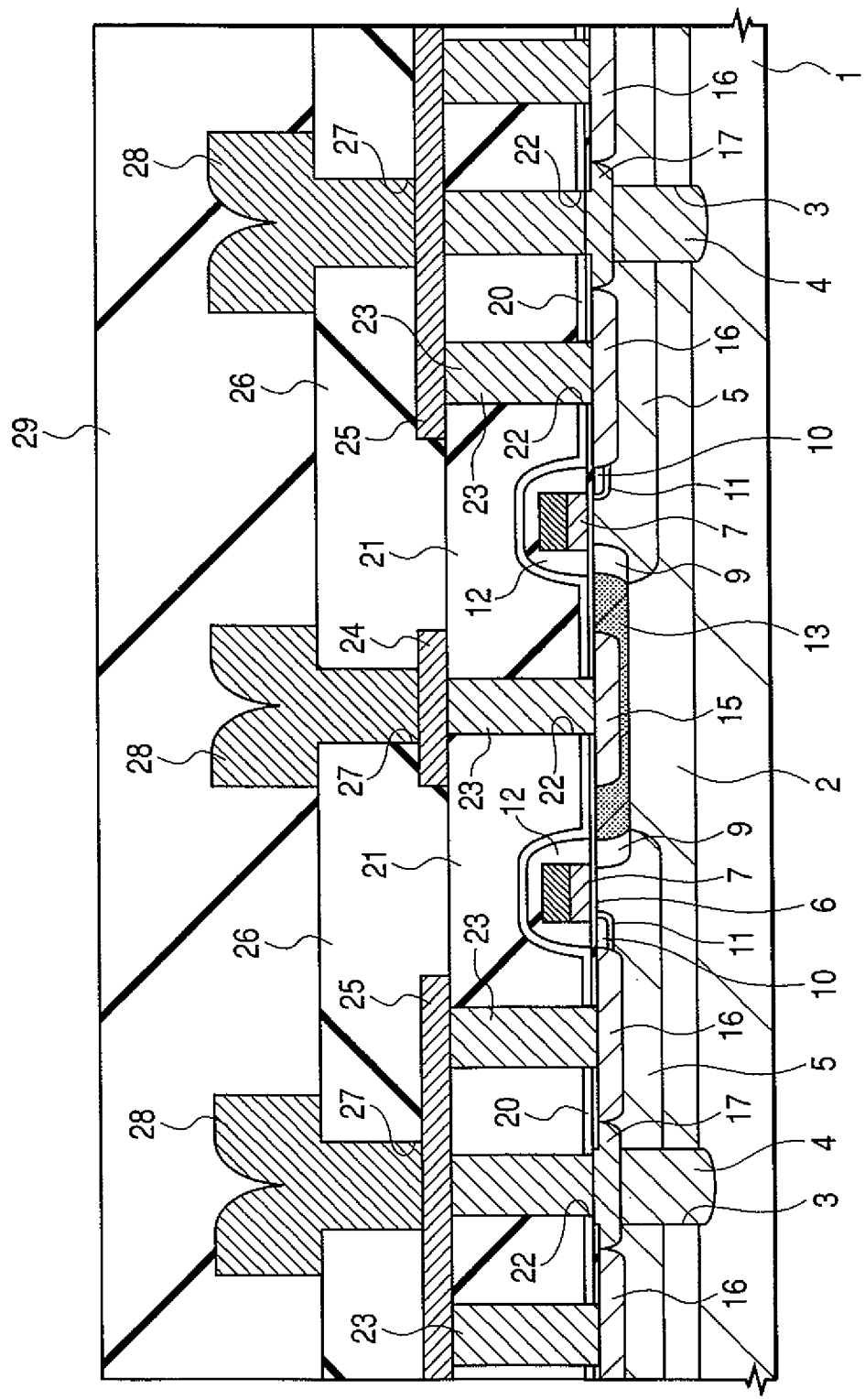
FIG. 16 is a fragmentary cross-sectional view illustrating the semiconductor device during a manufacturing step following that of FIG. 15.

As illustrated in FIG. 16, a silicon oxide film 26 having a thickness of about 900 nm is deposited over the drain electrode 24 and source electrode 25 by CVD, and, then, a through-hole 27 is formed by etching a portion of the silicon oxide film 26. Then, an interconnect 28 composed mainly of an aluminum (Al) alloy film is formed over the silicon oxide film 26 to connect the interconnect 28 and the drain electrode 24, and the interconnect 28 and the source electrode 25, respectively. Over the interconnect 28, a surface protective film 29 is then formed using a silicon oxide film having a thickness of about 300 nm and a silicon nitride film having a thickness of about 500 nm by CVD.

After a portion of the surface protective film 29 is selectively removed to expose a portion of the interconnect 28 (a pad portion not illustrated in FIG. 16), the back surface of the substrate 1 is polished by about 280 nm, and, then, a source rear electrode 31 is formed on the back surface of the substrate 1. By the steps so far described, the power amplifier circuit as illustrated in FIG. 2 is substantially completed. The source rear electrode 31 is formed, for example, by successively depositing a nickel (Ni) film having a thickness of about 0.1 μm, a titanium (Ti) film having a thickness of about 0.15 μm, an Ni film having a thickness of about 0.1 μm and a gold (Au) film having a thickness of about 1.3 μm by sputtering. The substrate 1 is separated into individual semiconductor chip, which are then soldered onto a module substrate via the source rear electrode 31.

Figures 17, 18:
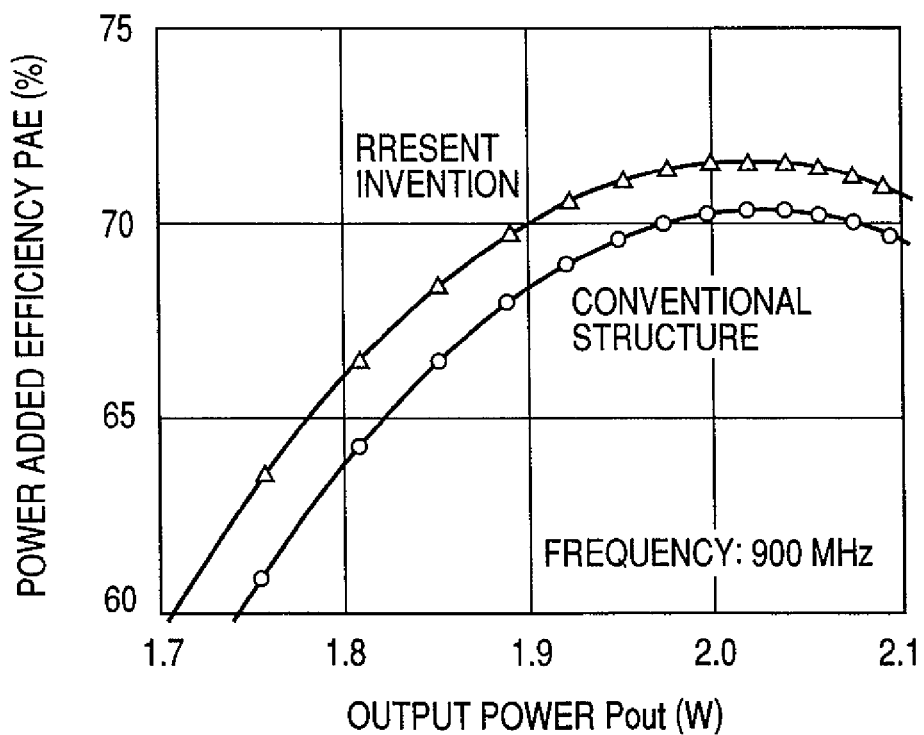
FIG. 17 is a table showing a comparison between the structure of the present invention and a conventional structure in on resistance (Ron) and feedback capacitance (Cgd)
FIG. 18 is a graph showing a comparison between the structure of the present invention and the conventional structure in power added efficiency when a sinusoidal signal having a frequency of 900 MHz is input.

FIG. 17 shows comparison in the feedback capacitance (Cgd) and on resistance (Ron) between the power MOSFET of this Embodiment and the conventional power MOSFET. In the former one, the offset drain region existing between the gate electrode 7 and the n⁺ type drain region 15 has a double offset structure; more specifically, the n⁻ type offset drain region 9 close to the gate electrode 7 is adjusted to have a relatively low impurity concentration, and the n type offset drain region 13 spaced from the gate electrode 7 is adjusted to have a relatively high impurity concentration. The conventional one does not have such a double offset structure. As illustrated in this diagram, the power MOSFET according to this Embodiment has reduced feedback capacitance (Cgd) and reduced on resistance (Ron) compared with the conventional power MOSFET.

As a result, as illustrated in FIG. 18, it has been revealed by actual measurement performed by the present inventors that the power added efficiency (PAE) of an amplifier circuit using the power MOSFET of this embodiment is improved by about 2% over that of the amplifier circuit using the conventional power MOSFET.

Figure 19:
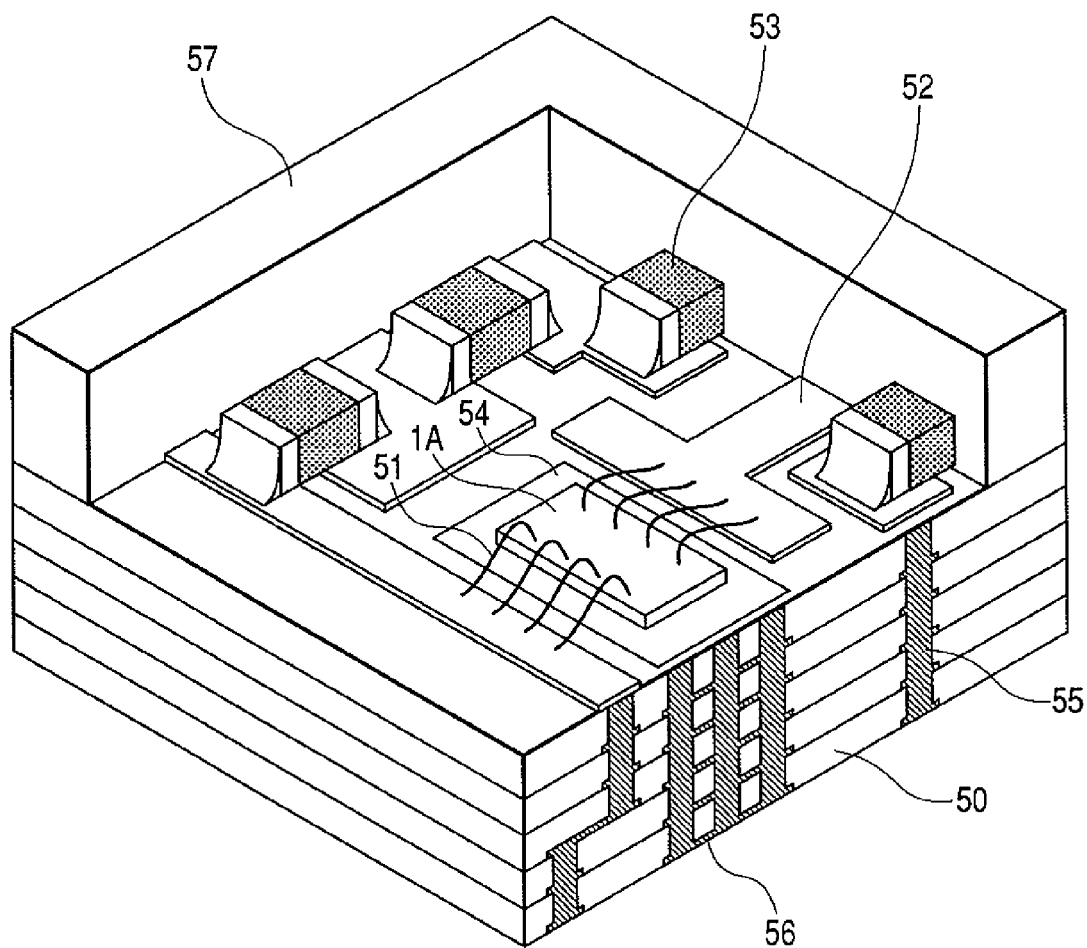
FIG. 19 is a diagrammatic perspective view illustrating an RF power module having an amplifier circuit according to one embodiment of the present invention.
Figure 20:
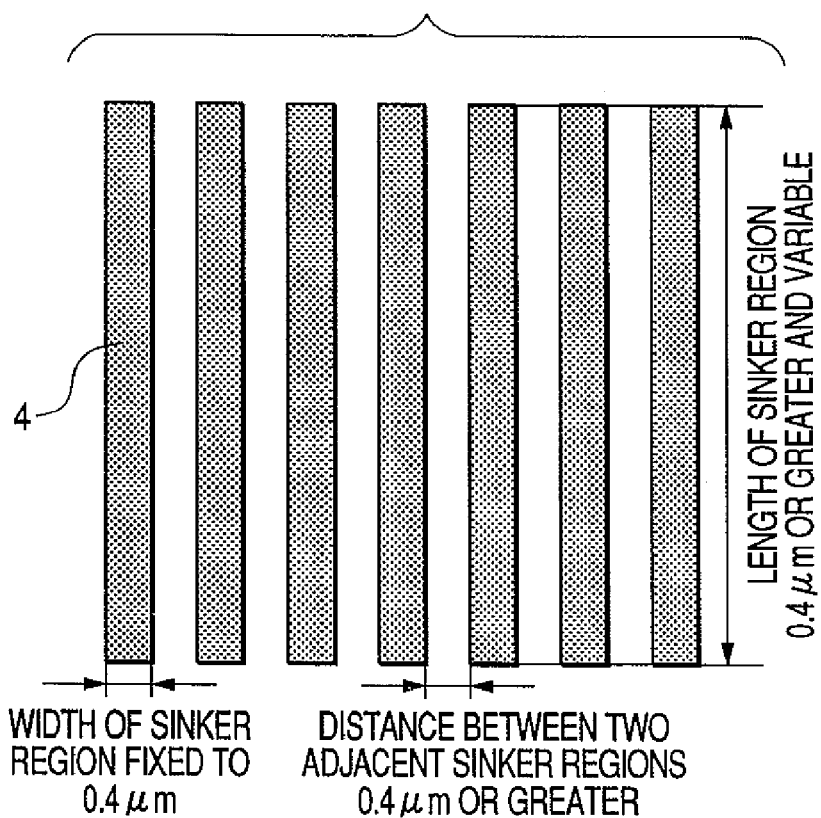
FIG. 20 is a plan view illustrating a plane layout of rectangular sinker layers having the width of one side fixed.

FIG. 19 is a perspective view of an RF power module on which a semiconductor chip 1A having an amplifier circuit using the power MOSFET of this Embodiment has been mounted.

The semiconductor chip 1A is installed in a cavity while the backside of the substrate 1 is disposed opposite to the main surface of a module substrate 50. The semiconductor chip 1A is electrically connected to a transmission line 52 via an Au wire 51. In addition to the semiconductor chip 1A, a condenser 53 for impedance matching is connected to the transmission line 52. The Au wire 51 functions as an inductor, while the transmission line 52 functions as an inductor for impedance matching. The source rear electrode 31 formed over the backside of the substrate 1 is soldered onto an electrode 54 for chip mounting. The electrode 54 is electrically and thermally joined with a GND electrode 56 on the backside of the module substrate 50 via a thermal via 55 in the module substrate 50. The main surface of the module substrate 50 is covered with a mold resin 57 and the semiconductor chip 1A and condenser 53 are sealed therewith.

Embodiment 2

In the power MOSFET according to Embodiment 1, a p type sinker layer 4 is formed by embedding a heavily doped p type polysilicon film inside of the trench 3. The p type sinker layer 4 formed by the present method is advantageous over a sinker layer formed by ion implantation of an impurity, because the parasitic resistance of the former one can be made lower than that of the latter one.

However, formation of the sinker layer by embedding a conductive film inside of the trench requires the digging of a deep trench in the substrate 1 so that it imposes many restrictions on the process and disturbs free disposal of the sinker layer. More specifically, for the formation of a sinker layer by embedding a trench with a conductive film, such as polysilicon film or metal film, a trench with a high aspect ratio is dug first, and, then, a conductive film is filled in the trench without a space. The appearance of voids in the conductive film inside of the trench disturbs the planarization of the surface of the substrate, which presumably leads to defects, such as peeling of the film, owing to the step difference of the sinker layer in various subsequent film deposition steps. The width of the trench is therefore limited by the depth of the trench or a conductive film deposition apparatus employed for the deposition.

With regard to the plane layout of the sinker layer, a rectangular shape which has a predetermined width at one side is most free from defects. In such a shape, the conductive film is embedded uniformly, because the trench has no regions that are different in width.

Figure 21:
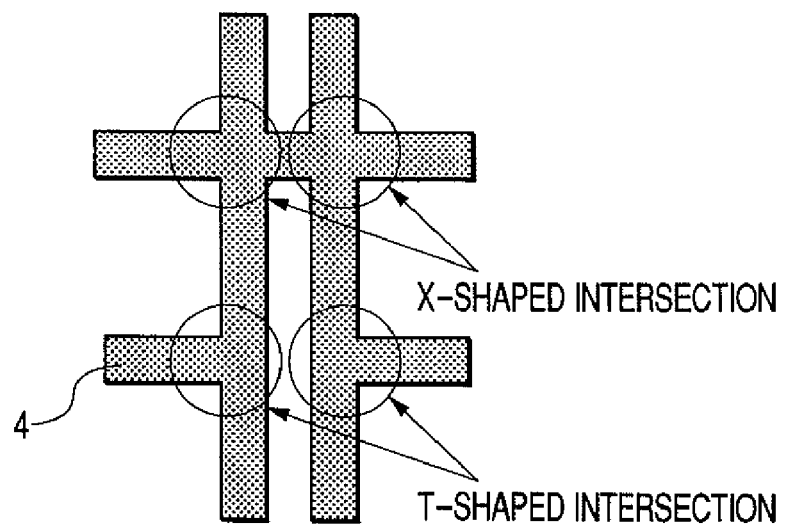
FIG. 21 is a plan view illustrating a layout of rectangular sinker layers forming an X-shaped or T-shaped intersection.

As illustrated in FIG. 21, on the other hand, when rectangular trenches cross in an X shape or T shape, the trenches become wider at the intersection thereof than at the other portion of the trenches. The trench may have a larger width at this intersection so that there is a possibility that the conductive film is not uniformly embedded in the trench and defects such as peeling of the film occur, as described above. If there is a conductive film deposition apparatus that is capable of embedding a conductive film uniformly even in such a widened trench, such an X-shaped or T-shaped layout can be adopted. Most of the apparatuses do not have such a capacity. Moreover, in consideration of the large trench depth of such a sinker layer, the width and distance of the trenches must be wider than the width of the contact hole to be connected to the sinker layer.

Figure 22:
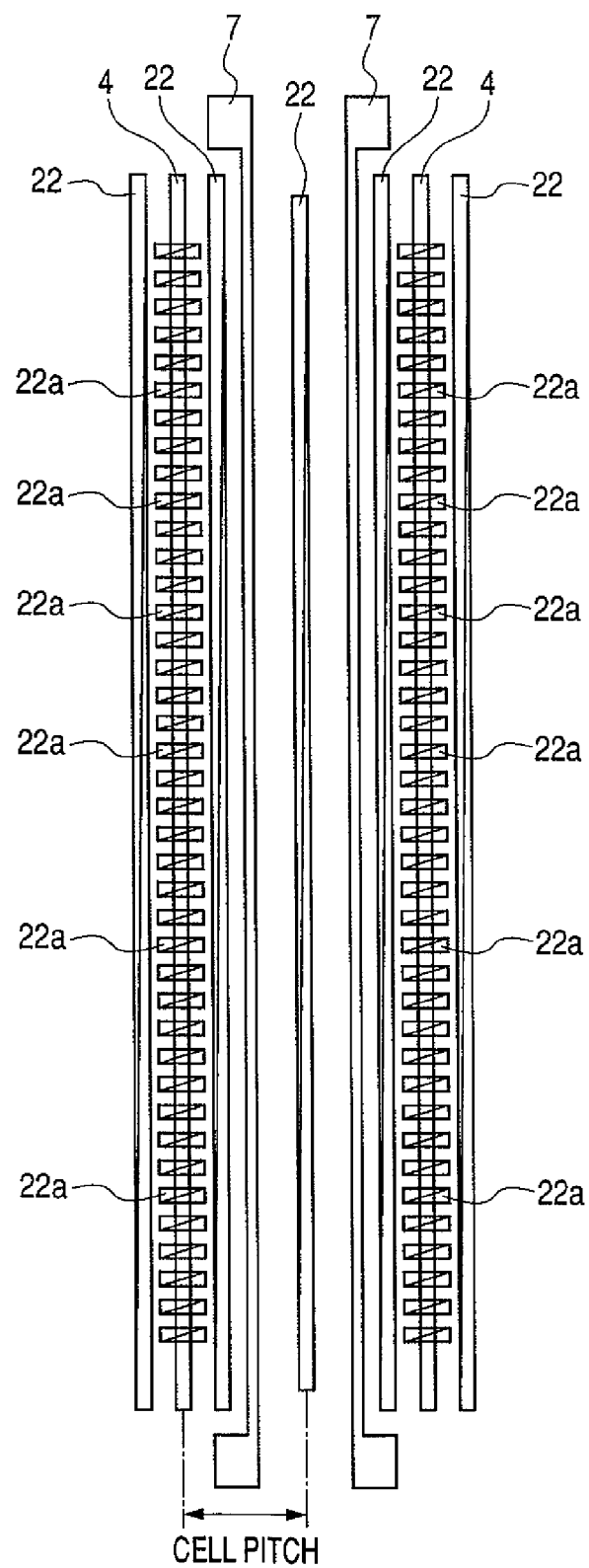
FIG. 22 is a plan view illustrating a layout of rectangular sinker layers arranged so that their longitudinal direction is parallel to the longitudinal direction of the finger.

In a finger-shaped power MOSFET, when the longitudinal direction of the sinker layer 4 is arranged in parallel to the longitudinal direction of the finger, as illustrated in FIG. 22, it is necessary to arrange a plurality of the sinker layers 4 and contact holes 22a to be connected thereto in a direction vertical to the finger in consideration of the mask alignment margin and to widen both ends in the longitudinal direction by a length corresponding to the mask overlay accuracy.

Figure 23:
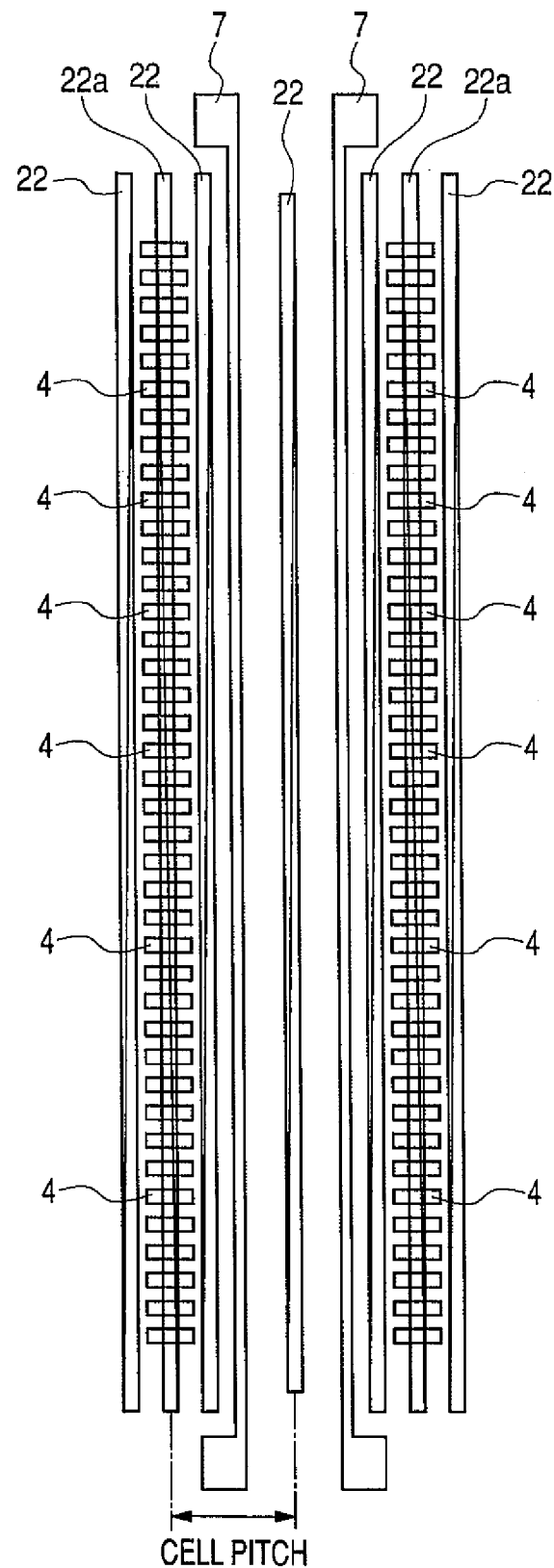
FIG. 23 is a plan view illustrating a layout of rectangular sinker layers arranged so that their longitudinal direction is vertical to the longitudinal direction of the finger.
Figure 24:
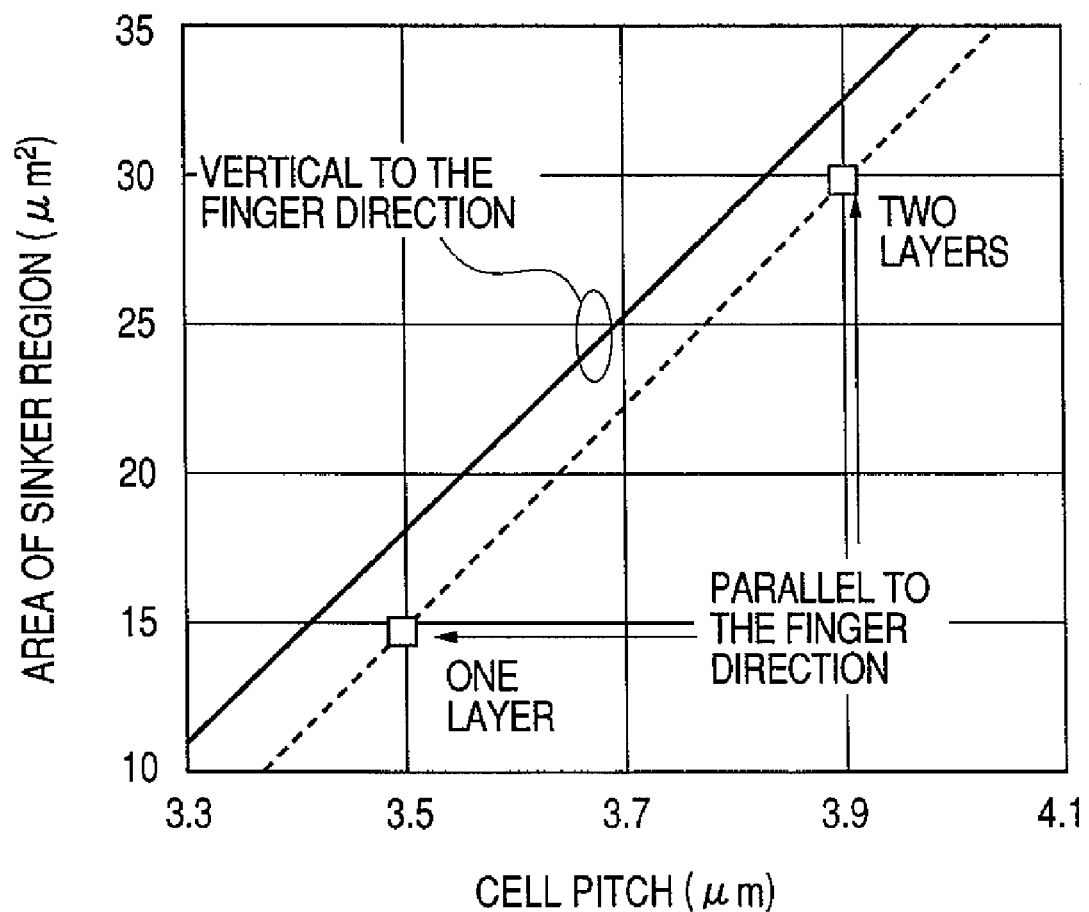
FIG. 24 is a graph for comparing the area of the rectangular sinker layer between the rectangular sinker layers arranged in parallel and the rectangular sinker layers arranged vertical, each relative to the longitudinal direction of the finger.

When the longitudinal direction of the sinker layer 4 is arranged vertical to the longitudinal direction of the finger, as illustrated in FIG. 23, on the other hand, not the sinker layer 4 and contact hole 22a, but only the sinker layer 4 is widened by a length corresponding to the mask overlay accuracy. Compared with the layout of FIG. 22, the area of the sinker layer 4 is wider in the layout of FIG. 23, resulting in a reduction in the parasitic resistance of the sinker layer 4. FIG. 24 illustrates a comparison in the area of the sinker layer 4 as a function of the cell pitch between the parallel layout of FIG. 22 and the vertical layout of FIG. 23 when the width of one side of the sinker layer 4 is 0.4 µm and the distance between two adjacent sinker layers 4 is 0.4 µm. As is apparent from this graph, the area of the sinker layer 4 is greater in the vertical layout (solid line) than in the parallel layout (dashed line), so that in the former case, the parasitic resistance can be reduced.

In the layout of the sinker layer 4, as illustrated in FIG. 22, owing to a discrete optimum cell pitch, disposal of the sinker layers 4 is limited. The width of one side of the sinker layer 4 is 0.4 µm and the distance between two adjacent sinker layers 4 is 0.4 µm. For example, assuming that the cell pitch when one sinker layer 4 is disposed adjacent to the source and parallel to the longitudinal direction of the finger is 3.5 µm, the cell pitch becomes 3.9 µm by an increase in the number of sinker layers to two.

In the layout of the sinker layer 4, as illustrated in FIG. 23, on the other hand, the length of the sinker layer 4 in the longitudinal direction may be changed, depending on the cell pitch. It is therefore possible to change the cell pitch relatively freely in view of the surrounding conditions.

Figure 25:
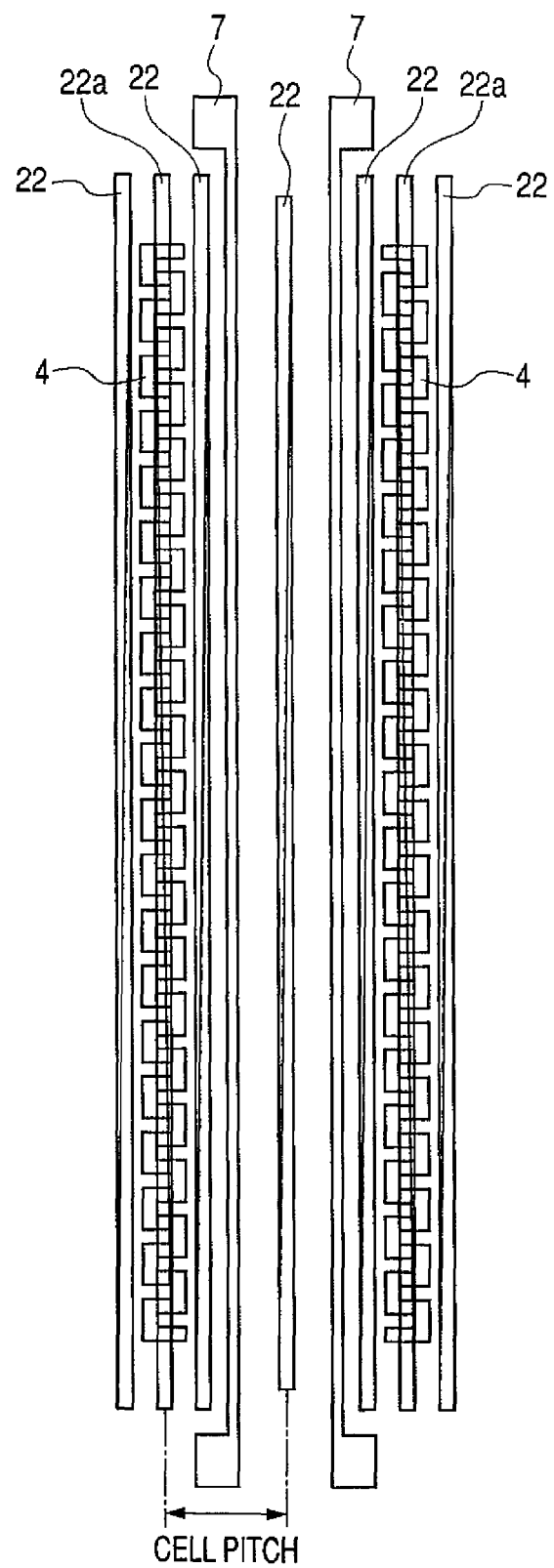
FIG. 25 is a plan view illustrating the layout of the sinker layers arranged in a meander form.
Figure 26:
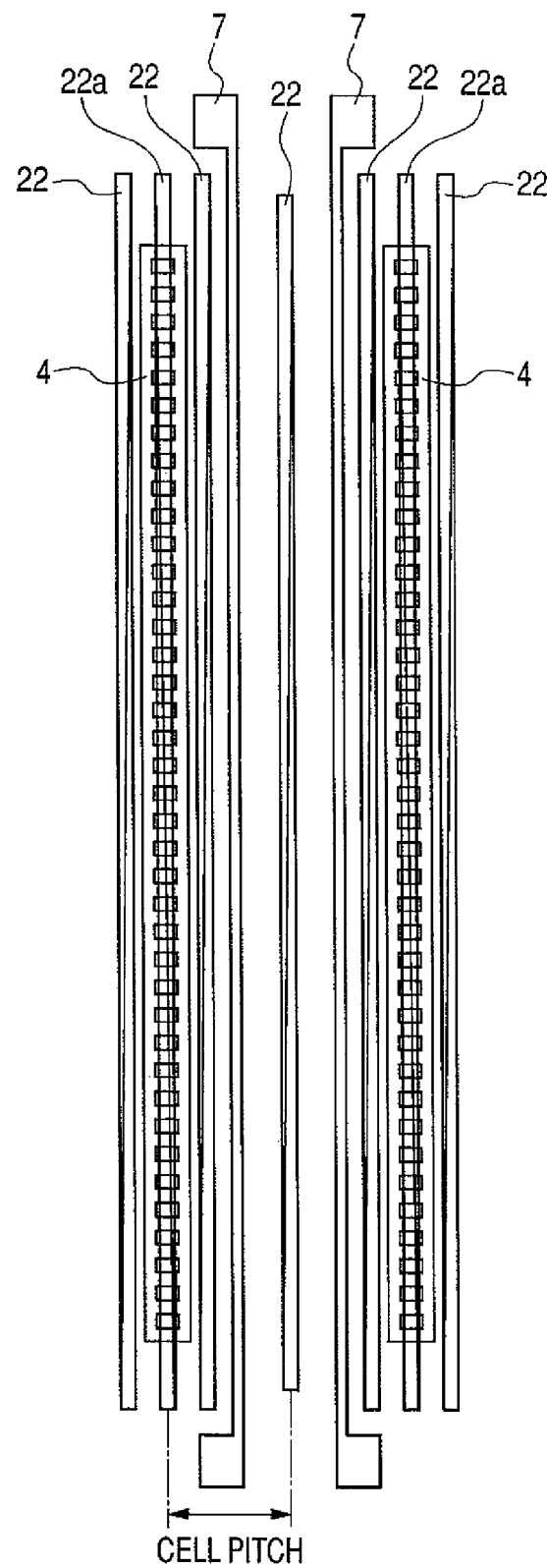
FIG. 26 is a plan view illustrating the layout of the sinker layers arranged in a mesh form.

FIG. 25 is a plane layout of the sinker layer 4 when disposed in a meander form, while FIG. 26 is a plane layout of the sinker layer 4 when disposed in a mesh form. In these layouts, a conductive film cannot be embedded so easily as in the layout of FIG. 23, because of a partial difference in the width of the sinker layer 4. Since the area of the sinker layer 4 is larger than that in FIG. 23, however, the parasitic resistance can be reduced further. Moreover, a change in the cell pitch can be carried out relatively easily.

Embodiment 3

Figure 27:
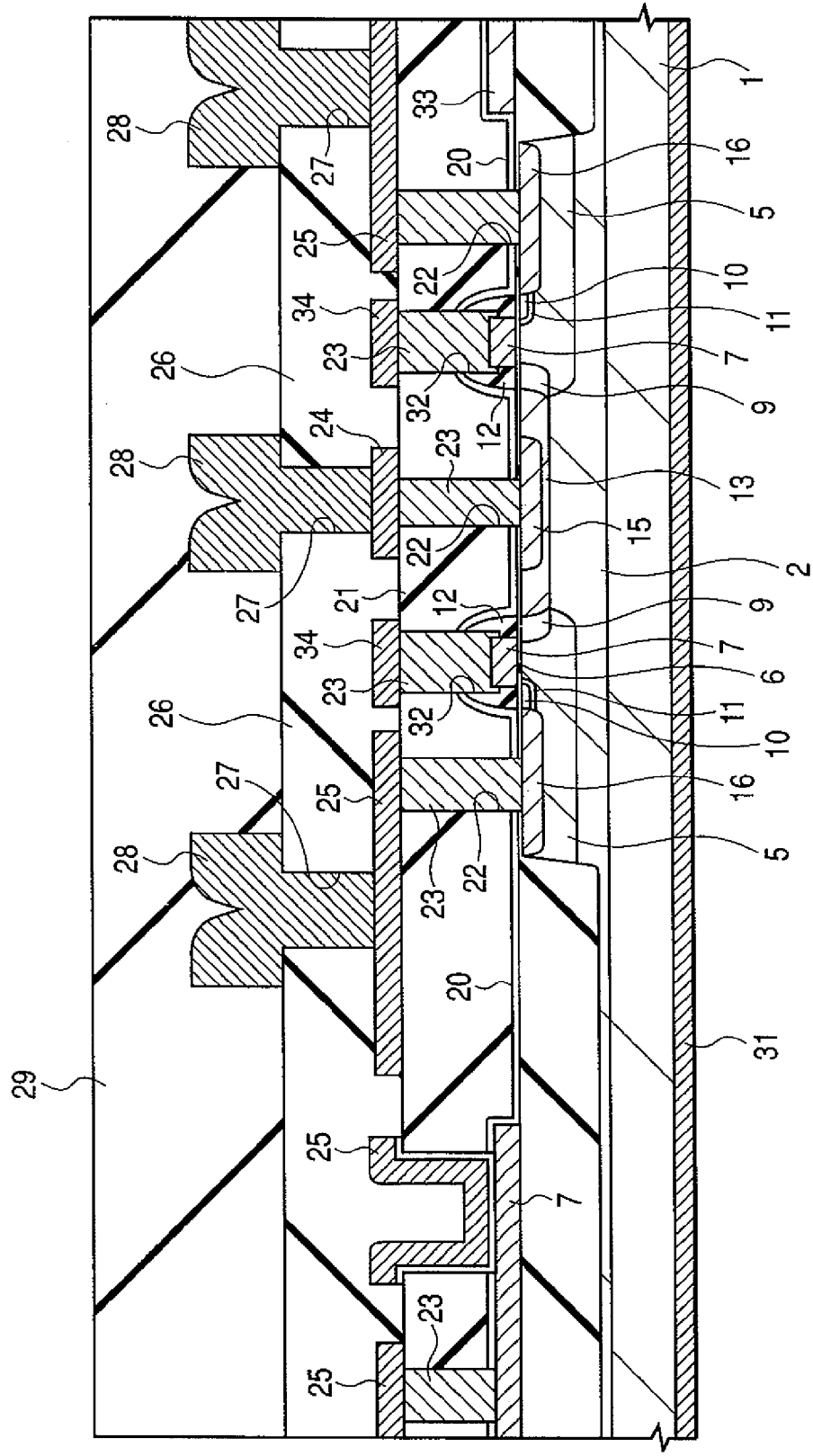
FIG. 27 is a fragmentary cross-sectional view of the semiconductor device of the present invention in which a gate electrode has been shunted with a plug.

FIG. 27 is a fragmentary cross-sectional view of a substrate 1 illustrating a power MOSFET according to this Embodiment. In the n channel type power MOSFET of this Embodiment, a gate electrode 7 is composed only of an n type polysilicon film, a long trench 32 is formed in an insulating film over the gate electrode 7, and the gate electrode 7 is shunted by a plug 23 embedded inside of this long trench 32. The plug 23 is, similar to the plug 23 embedded inside of the contact hole 22, made of a metal film composed mainly of a W film. The long trench 32 has a length almost equal to that of the gate electrode 7 and extends in parallel to the gate electrode 7.

The long trench 32 over the gate electrode 7 is formed in the following manner. After deposition of a silicon oxide film 21 over the power MOSFET, the silicon oxide film 21 is dry etched using a photoresist film as a mask. Etching is once terminated on the surface of the silicon nitride film 21 covering the upper portion of the gate electrode 7. Then, after dry etching of the silicon nitride film 21, the silicon oxide film (cap insulating film 8) below the silicon nitride film 21 is etched, whereby the long trench 32 reaching the surface of the gate electrode 7 is formed. In such a manner, by once terminating etching on the surface of the silicon nitride film 21 covering the upper portion of the gate electrode 7 and then etching the cap insulating film 8, an inconvenience such as penetration of the bottom portion of the long trench 32 through the substrate 1 can be prevented even if the width of the long trench 32 is made greater than the gate length of the gate electrode 7. This makes it possible to adjust the width of the long trench 32 so that it is wider than the gate length of the gate electrode 7 and to reduce the contact resistance between the plug 23 to be embedded in the long trench 32 and the gate electrode 7. The plug 23 can be embedded inside of the long trench 32 simultaneously with the embedding of the plug 23 in the contact hole 22 over the source and drain.

By shunting the gate electrode 7 with a low resistance plug 23 made of a metal film embedded in the long trench 32 over the gate electrode 7 and thereby reducing its sheet resistance, the provision of a first-level or second-level Al alloy interconnect for shunting the gate electrode 7 becomes unnecessary. This makes it possible to eliminate a wiring region of an Al alloy interconnect for shunting, whereby the size of the semiconductor chip 1A on which the power MOSFET is to be formed can be reduced and a size reduction of the RF power module can be promoted.

Moreover, by constituting the gate electrode 7 only from a single polysilicon film, the gate electrode of the p channel power MOSFET can be constituted from a p type polysilicon film. This makes it possible to form the p channel type power MOSFET as a surface channel type which hardly causes short channel effects, so that an improvement in the performance of the p channel type power MOSFET by miniaturization can be promoted.

Furthermore, by constituting the gate electrode 7 from a single polysilicon film, a resistor 33 can be formed in the same semiconductor chip 1A by using this single polysilicon film. In addition, the gate electrode 7 composed of a single polysilicon film can be used as one electrode of an MIM (Metal Insulator Metal) type capacitor. As described above, by constituting the gate electrode 7 from a single polysilicon film and shunting the gate electrode 7 with the plug 23 embedded in the long trench 32 over the gate electrode 7, it is possible to form the resistor 33 or capacitor easily within the same semiconductor chip 1A and, therefore, to promote integration of all of the functions of the RF power module in one chip. In addition, this facilitates the interconnection layout of the module substrate 50 on which the semiconductor chip 1A is mounted, so that improvement of power added efficiency and size reduction of the RF power module can be promoted.

The invention completed by the present inventors has been described specifically based on some embodiments. However, it should be borne in mind that the present invention is not limited to or by the specifically described embodiments, but it can be modified within an extent not departing from the scope of the invention.

The power MOSFET according to the invention is suited for use in an RF power amplifier for mobile phones.

What is claimed is:

1. A semiconductor device including an MOSFET, comprising:
    source regions and drain regions formed in a semiconductor substrate of a first conductivity type and being spaced apart, in a first direction, by channel regions of a second conductivity type, the source and the drain regions each having the second conductivity type;
    semiconductor regions of the second conductivity type formed in the semiconductor substrate and arranged between the source regions adjacent to each other in the first direction;
    gate electrodes formed over the semiconductor substrate and extending in a second direction crossing the first direction;
    metal wirings formed over the semiconductor substrate; and
    a plurality of sinker layers formed in the semiconductor substrate,
    wherein each of the sinker layers is buried in a trench formed in the semiconductor substrate such that at least one of the semiconductor regions is arranged in a vicinity of a surface the sinker layer, such that the sinker layer is electrically connected to the semiconductor region and to the channel region and such that the sinker layer has a plane pattern having a long side in the second direction and is electrically connected to the metal wiring through a plurality of first contact holes arranged in the second direction.

2. A semiconductor device according to claim 1, wherein the metal wiring is electrically connected to the source regions through second contact holes spaced apart from the first contact holes.

3. A semiconductor device including a power MOSFET, comprising:
    a source region and a drain region formed in a semiconductor substrate of a first conductivity type and being spaced apart, in a first direction, by a channel formation region of a second conductive type,
    the source and the drain region having the second conductive type,
    a semiconductor region of the second conductive type formed in the semiconductor substrate and arranged adjacent to the source region in the first direction;
    a gate electrode formed over the semiconductor substrate and extending in a second direction crossing the first direction;
    a metal wiring formed over the semiconductor substrate; and
    a sinker layer buried in a trench formed in the semiconductor substrate such that the semiconductor region is arranged in the vicinity of the surface the sinker layer, such that the sinker layer is electrically connected to the semiconductor region and the channel formation region and such that the sinker layer has a plane pattern having a long side in the second direction and are electrically connected to the metal wiring through a plurality of first contact holes arranged in the second direction.

4. A semiconductor device according to claim 3, wherein the sinker layer is comprised of a metal.

5. A semiconductor device according to claim 3, wherein the sinker layer is comprised of a silicon film, wherein the sinker layer has the first conductive type such that an impurity concentration of the semiconductor regions is greater than an impurity concentration of the sinker layer.

6. A semiconductor device according to claim 3, wherein the metal wiring is electrically connected to the source region through a second contact hole spaced apart from the first contact holes.

7. A semiconductor device according to claim 1, wherein the MOSFET is a power MOSFET.

8. A semiconductor device according to claim 1, wherein the sinker layer is comprised of a metal film.

9. A semiconductor device according to claim 1, wherein the sinker layer is comprised of a silicon film, wherein the sinker layer has the first conductivity type such that an impurity concentration of the semiconductor regions is greater than an impurity concentration of the sinker layer.

* * * * *